(12) United States Patent
Yamaguchi et al.

(10) Patent No.: US 8,343,827 B2
(45) Date of Patent: Jan. 1, 2013

(54) SEMICONDUCTOR DEVICE AND MANUFACTURING METHOD OF THE SAME

(75) Inventors: Tadashi Yamaguchi, Kanagawa (JP);
Keiichiro Kashihara, Kanagawa (JP);
Yoji Kawasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/182,750

(22) Filed: Jul. 14, 2011

(65) Prior Publication Data

US 2012/0049201 A1     Mar. 1, 2012

(30) Foreign Application Priority Data

Aug. 25, 2010    (JP) ................................. 2010-188443

(51) Int. Cl.
*H01L 21/8238*      (2006.01)
(52) U.S. Cl. ......... 438/231; 438/303; 438/305; 438/549
(58) Field of Classification Search .................. 438/231, 438/303, 305, 549, 649; 257/408, 336, E27.062, 257/E21.634
See application file for complete search history.

(56) References Cited

U.S. PATENT DOCUMENTS

| | | | |
|---|---|---|---|
| 7,381,602 B2 * | 6/2008 | Hohage et al. ................ | 438/197 |
| 2006/0073656 A1 * | 4/2006 | Jain et al. ...................... | 438/233 |
| 2007/0254461 A1 | 11/2007 | Wei et al. | |

OTHER PUBLICATIONS

Yang, B., et al., "High-performance nMOSFET with in-situ Phosphorus-doped embedded Si:C (ISPD eSi:C) source-drain stressor", IEDM Tech. Dig., 2008, pp. 51-54.
Chung, S., et al., Design of High-Performance and Highly Reliable nMOSFETs with Embedded *Si:C S/D Extension* Stressor(Si:C S/D-E), 2009 Symposium on VLSI Technology Digest of Technical Papers, pp. 158-159.

* cited by examiner

*Primary Examiner* — Theresa T Doan
(74) *Attorney, Agent, or Firm* — McDermott Will & Emery LLP

(57) ABSTRACT

In a CMIS device, to improve the operating characteristics of an n-channel electric field transistor that is formed by using a strained silicon technique, without degrading the operating characteristics of a p-channel field effect transistor. After forming a source/drain (an n-type extension region and an n-type diffusion region) of an nMIS and a source/drain (a p-type extension region and a p-type diffusion region) of a pMIS, the each source/drain having a desired concentration profile and resistance, a Si:C layer having a desired amount of strain is formed in the n-type diffusion region, and thus the optimum parasitic resistance and the optimum amount of strain in the Si:C layer are obtained in the source/drain of the nMIS. Moreover, by performing a heat treatment in forming the Si:C layer in a short time equal to or shorter than 1 millisecond, a change in the concentration profile of the respective p-type impurities of the already-formed p-type extension region and p-type diffusion region is suppressed.

6 Claims, 18 Drawing Sheets

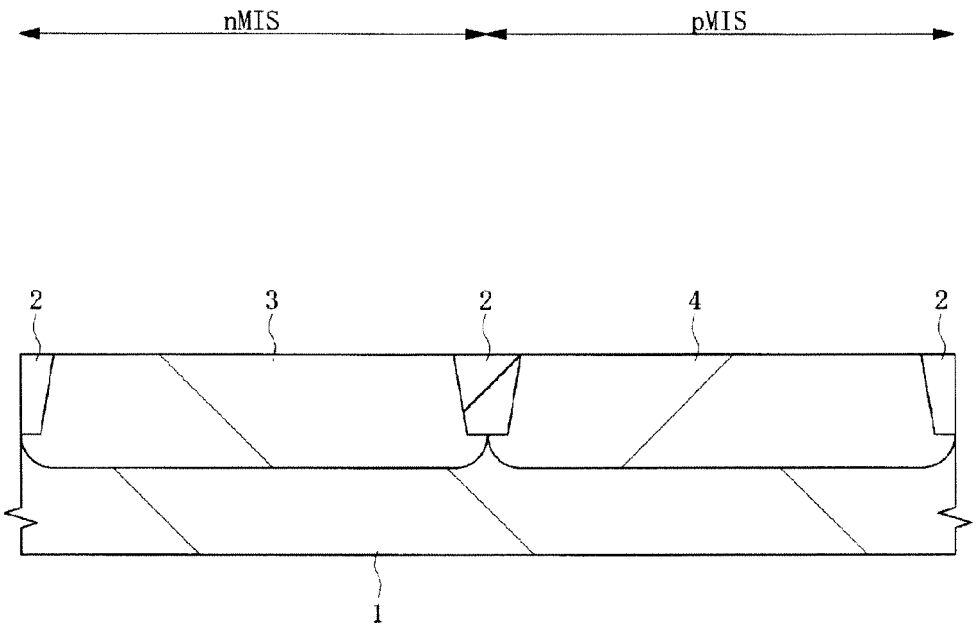
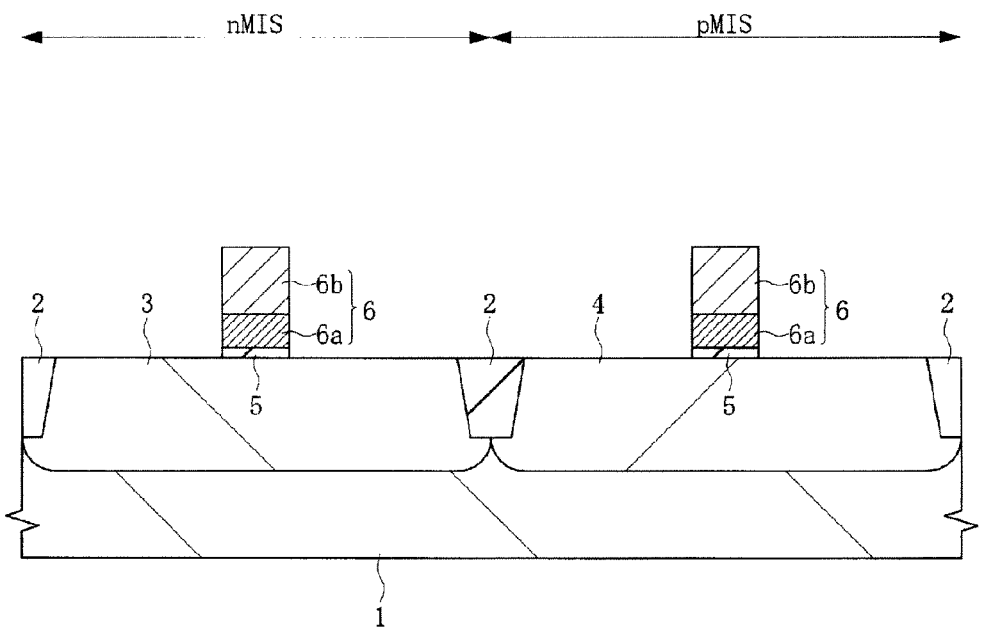

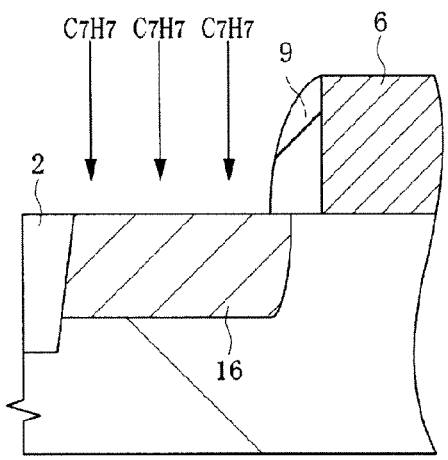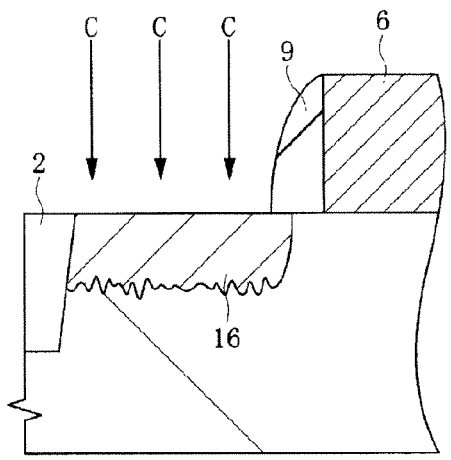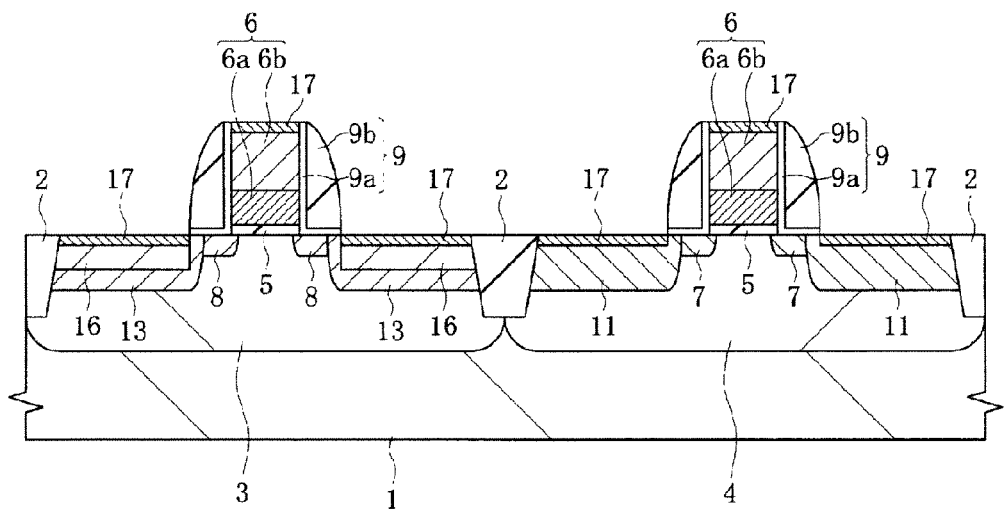

SEMICONDUCTOR DEVICE AND MANUFACTURING METHOD OF THE SAME

CROSS-REFERENCE TO RELATED APPLICATION

The disclosure of Japanese Patent Application No. 2010-188443 filed on Aug. 25, 2010 including the specification, drawings and abstract is incorporated herein by reference in its entirety.

BACKGROUND

The present invention relates to a semiconductor device and a technique for manufacturing the same, and in particular relates to the structure of a field effect transistor which achieves an increase in the speed by utilizing the strain in a channel, and to the techniques effectively applied to the manufacturing of the field effect transistor.

One of the techniques for achieving a further increase in the speed of a CMIS (Complementary Metal Insulator Semiconductor) device is a strained silicon (Si) technique. This is a technique capable of achieving the improvement in the carrier mobility by applying a strain to a silicon layer. That is, if the silicon crystal lattice in a channel is strained by applying a stress to the channel, the symmetry of the band structure of the isotropic silicon crystal is broken, resulting in splitting in energy levels. As a result of the change of the band structure of the silicon crystal, the carrier scattering due to lattice vibration decreases or the effective mass decreases and so on, which improves the mobility of electrons and holes.

The examples of the strained silicon technique include a method of forming a Si:C layer, in which a part of the crystal lattice of silicon (Si) is substituted by carbon (C), in a source/drain (hereinafter, this source/drain is referred to as the Si:C source/drain), a method of forming a source/drain from a crystallized mixture made by forming a solid solution with a predetermined amount of germanium (Ge) into silicon (Si) (hereinafter, this source/drain is referred to as the embedded SiGe source/drain), SMT (Stress Memorization Technique), and DSL (Dual Stress Liner), some of which are already applied to commercial products.

The Si:C source/drain is formed by the strained silicon technique applied to an n-channel field effect transistor. The example of the strained silicon technique include a method of forming the Si:C layer by CVD (Chemical Vapor Deposition) (see Non-Patent Document 1 (B. Yang, "High-performance nMOSFET with in-situ Phosphorus-doped embedded Si:C (ISPD eSi:C) source-drain stressor", in IEDM Tech. Dig, 2008, pp. 51-55)), and a method of forming the Si:C layer by ion-implanting carbon in forming an impurity diffusion layer constituting the source/drain (see Patent Document 1 (US Patent Application Publication 2007-0254461), and Non-Patent Document 2 (S. S. Chung, "Design of High-Performance and Highly Reliable nMOSFETs with Embedded Si:C S/D Extension Stressor (Si:C S/D-E)", in Symp. VLSI Tech. Dig., 2009, pp. 158-159)).

SUMMARY

The present inventors have been developing a field effect transistor to which the Si:C source/drain is applied. More specifically, the Si:C layer is formed in the source/drain of an n-channel field effect transistor to thereby apply a strong tensile stress to the channel and improve the mobility of electrons, and thus the improvement of the performance of the n-channel field effect transistor is carried out.

First, a method is briefly described for manufacturing a CMIS device comprising an n-channel field effect transistor having the Si:C layer, which is formed by CVD, in the source/drain.

Over the major surface of a substrate, a gate insulating film and a gate electrode of the n-channel field effect transistor and a gate insulating film and a gate electrode of the p-channel field effect transistor are formed, and subsequently, a first n-type impurity diffusion layer is formed in the substrate on both sides of the gate electrode of the n-channel field effect transistor and a first p-type impurities diffusion layer is formed in the substrate on both sides of the gate electrode of the p-channel field effect transistor. Subsequently, a sidewall is formed in the respective sidewalls of the gate electrode of the n-channel field effect transistor and the gate electrode of the p-channel field effect transistor. Subsequently, the substrate on both sides of the sidewall of the n-channel field effect transistor is selectively etched, and then in this selectively etched region the Si:C layer is formed by CVD. Subsequently, a second n-type impurity diffusion layer is formed in the Si:C layer on both sides of the sidewall of the n-channel field effect transistor, and a second p-type impurity diffusion layer is formed in the substrate on both sides of the sidewall of the p-channel field effect transistor. Subsequently, by applying a heat treatment to the substrate, the n-type impurities within the first and second n-type impurity diffusion layers and the p-type impurities within the first and second p-type impurity diffusion layers are activated to thereby form a pair of source/drain of the n-channel field effect transistor, the pair of source/drain comprising the first and second n-type impurity diffusion layers, and to thereby form a pair of source/drain of the p-channel field effect transistor, the pair of source/drain comprising the first and second p-type impurity diffusion layers.

Next, a method will be described for manufacturing a CMIS device comprising an n-channel field effect transistor having the Si:C layer, which is formed by ion implantation, in the source/drain.

Over the major surface of a substrate, a gate insulating film and a gate electrode of the n-channel field effect transistor, and a gate insulating film and a gate electrode of the p-channel field effect transistor are formed, and subsequently, a first n-type impurity diffusion layer is formed in the substrate on both sides of the gate electrode of the n-channel field effect transistor, and a first p-type impurity diffusion layer is formed in the substrate on both sides of the gate electrode of the p-channel field effect transistor. Subsequently, a sidewall is formed in the respective sidewalls of the gate electrode of the n-channel field effect transistor and the gate electrode of the p-channel field effect transistor. After that, a second n-type impurity diffusion layer is formed in the substrate on both sides of the sidewall of the n-channel field effect transistor, and a second p-type impurity diffusion layer is formed in the substrate on both sides of the sidewall of the p-channel field effect transistor. Then, carbon is ion-implanted into the second n-type impurity diffusion layer on both sides of the sidewall of the n-channel field effect transistor. Subsequently, by applying a heat treatment to the substrate, the n-type impurities within the first and second n-type impurity diffusion layers and the p-type impurities within the first and second p-type impurity diffusion layers are activated to thereby form a pair of source/drain of the n-channel field effect transistor, the pair of source/drain comprising the first and second n-type impurity diffusion layers, and to thereby form a pair of source/drain of the p-channel field effect transistor, the pair of source/drain comprising the first and second p-type impurity diffusion layers. At the same time, the substrate is recrystalized to form the Si:C layer in the region in which the source/drain of the n-channel field effect transistor is formed.

However, the CMIS device to which the Si:C source/drain is applied has various technical problems described below.

In forming the Si:C layer by CVD, the temperature of the substrate needs to be kept at approximately 500 to 700° C. for a long time. However, at this time, p-type impurities (in particular, boron (B)) within the first p-type impurity diffusion layer constituting a part of the source/drain of the p-channel field effect transistor gradually diffuse, and thus the operating characteristics of the p-channel field effect transistor degrade.

Moreover, in order to form the source/drain having a shallow junction, it is preferable to subject the substrate to a short-time heat treatment at a high temperature no less than 1000° C. and thus activate the n-type impurities within the first and second n-type impurity diffusion layers of the n-channel field effect transistor and the p-type impurities within the first and second p-type impurity diffusion layers of the p-channel field effect transistor. However, if a short-time heat treatment is performed at a high temperature no less than 1000° C., carbon is extracted from the inside of the Si:C layer formed by CVD and a desired carbon concentration cannot be obtained. Therefore, for the above-described activation of the n-type impurities and the p-type impurities, a long-time heat treatment at a temperature lower than 1000° C. is applied to the substrate. This results in a problem that in the p-channel field effect transistor the source/drain having a shallow junction cannot be formed.

Meanwhile, in forming the Si:C layer by ion implantation, it is necessary to apply a heat treatment to the substrate for recrystallization after ion-implanting carbon into the substrate. This heat treatment determines the amount of strain in the Si:C layer, the parasitic resistance of the respective first and second n-type impurity diffusion layers of the n-channel field effect transistor and the parasitic resistance of the respective first and second p-type impurity diffusion layers of the p-channel field effect transistor. Therefore, the optimization of the heat treatment condition is required. Moreover, since the amount of strain in the Si:C layer depends also on the implantation quantity and implantation energy in the ion implantation of carbon, the optimization of these conditions is also required. However, in the n-channel field effect transistor, since the profile of the respective first and second n-type impurity diffusion layers and the profile of strain are formed at the same time, the process window of the heat treatment condition and the ion implantation condition is narrow and it is therefore difficult to optimize the parasitic resistance of the respective first and second n-type impurity diffusion layers while optimizing the amount of strain in the optimum Si:C layer.

The present inventors have found that a high temperature and short-time heat treatment, such as LSA (Laser Spike Annealing) or FLA (Flash Lamp Annealing), is effective in order to increase the amount of strain in the Si:C layer. However, it has been found that only with LSA or FLA, the activation of the impurities other than the carbon does not sufficiently occur and thus the parasitic resistance becomes higher and the performance of the CMIS device degrades.

The present invention has been made in view of the over circumstances and provides techniques capable of improving the operating characteristics of the n-channel electric field transistor, which is formed using the strained silicon technique, without degrading the operating characteristics of the p-channel field effect transistor in a CMIS device.

The other purposes and the new feature of the present invention will become clear from the description of the present specification and the accompanying drawings.

The following explains briefly the outline of an embodiment of a typical invention among the inventions disclosed in the present application.

According to this embodiment, a semiconductor device includes an n-channel field effect transistor in a p-type well formed in a semiconductor substrate comprising single-crystal silicon, wherein a source/drain of the n-channel field effect transistor comprises: a first n-type impurity diffusion layer formed in the p-type well around under a sidewall of a gate electrode; and a second n-type impurity diffusion layer formed in the p-type well, apart from the sidewall of the gate electrode by a predetermined distance. Here, the position of a second junction between the second n-type impurity diffusion layer and the p-type well in the thickness direction of the semiconductor substrate is deeper than the position of a first junction between the first n-type impurity diffusion layer and the p-type well in the thickness direction of the semiconductor substrate. A Si:C layer, in which a part of the silicon lattice is substituted with carbon, is formed in the second n-type impurity diffusion layer. The position, at which a concentration of the carbon contained in the Si:C layer becomes the maximum, is deeper than the position of the first junction between the first n-type impurity diffusion layer and the p-type well in the thickness direction of the semiconductor substrate and is shallower than the position of the second junction between the second n-type impurity diffusion layer and the p-type well in the thickness direction of the semiconductor substrate.

Moreover, according to this embodiment, a method of manufacturing a semiconductor device, wherein an n-channel field effect transistor is formed in a major surface of a semiconductor substrate comprising single-crystal silicon, comprises the steps of: forming a gate insulating film and a gate electrode in the major surface of the semiconductor substrate; forming a first n-type impurity diffusion layer by ion-implanting first n-type impurities into the semiconductor substrate on both sides of the gate electrode; forming a sidewall comprising an insulating film in a sidewall of the gate electrode; forming a second n-type impurity diffusion layer by ion-implanting second n-type impurities into the semiconductor substrate on both sides of the sidewall; forming a pair of source/drain comprising the first n-type impurity diffusion layer and the second n-type impurity diffusion layer by applying a first heat treatment to the semiconductor substrate and thereby activating the first n-type impurities and the second n-type impurities; after the steps above, forming an amorphous layer by ion-implanting cluster carbon into the second n-type impurity diffusion layer; and forming a Si:C layer by applying a second heat treatment to the semiconductor substrate and thereby recrystallizing the amorphous layer. Here, the position of a second junction between the second n-type impurity diffusion layer and the p-type well in a thickness direction of the semiconductor substrate is deeper than the position of a first junction between the first n-type impurity diffusion layer and the p-type well in the thickness direction of the semiconductor substrate. The position, at which a concentration of the carbon contained in the Si:C layer becomes the maximum, is deeper than the position of the first junction between the first n-type impurity diffusion layer and the p-type well in the thickness direction of the semiconductor substrate and is shallower than the position of the second junction between the second n-type impurity diffusion layer and the p-type well in the thickness direction of the semiconductor substrate.

The following explains briefly the effect acquired by one embodiment of the typical invention among the inventions disclosed in the present application.

In a CMIS device, the operating characteristics of the n-channel electric field transistor, which are formed using the strained silicon technique, can be improved without degrading the operating characteristics of the p-channel field effect transistor.

BRIEF DESCRIPTION OF THE DRAWINGS

FIG. 2 is a cross-sectional view of the major portion showing a manufacturing step of the CMIS device according to Embodiment 1 of the present invention;

FIG. 3 is a cross-sectional view of the major portion of the same portion as that of FIG. 2 in a manufacturing step of the CMIS device following the manufacturing step of FIG. 2;

FIG. 10A is a cross-sectional view of a major portion of a semiconductor substrate for illustrating the ion implantation of cluster carbon;

FIG. 10B is a cross-sectional view of a major portion of a semiconductor substrate for illustrating the ion implantation of carbon;

FIG. 11 is a cross-sectional view of the major portion of the same portion as that of FIG. 2 in a manufacturing step of the CMIS device following the manufacturing step of FIG. 9;

DETAILED DESCRIPTION

Figure 1:
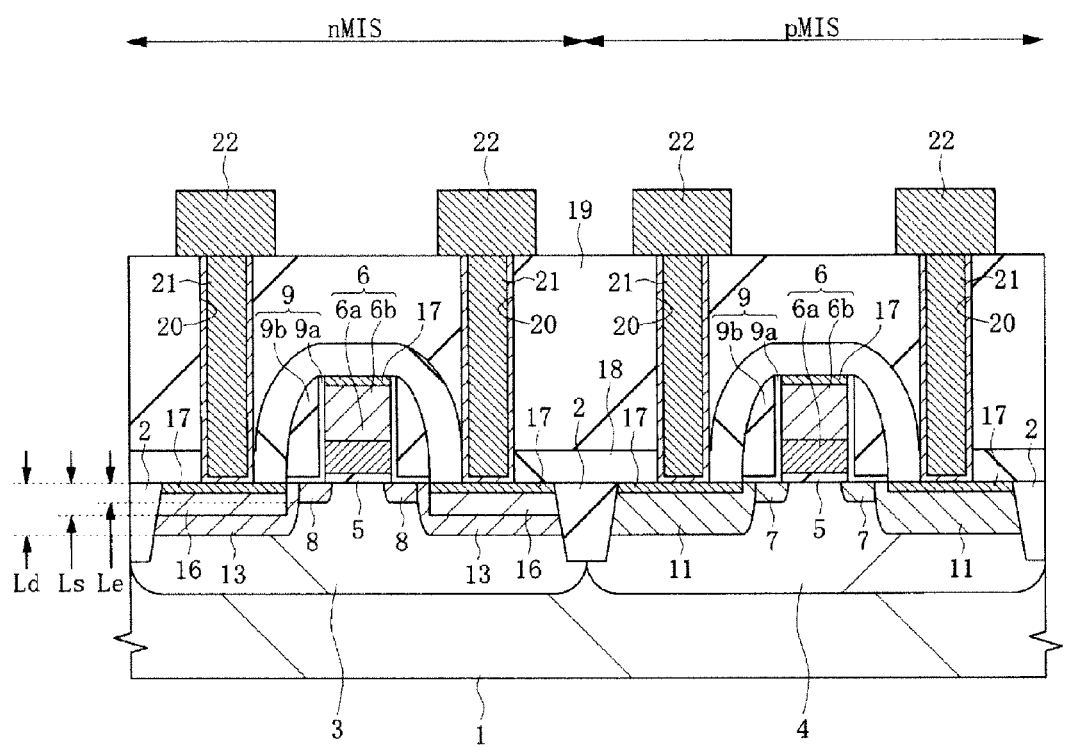
FIG. 1 is a cross-sectional view of a major portion of a CMIS device according to Embodiment 1 of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly instructed in particular and where they are clearly restricted to a specific number theoretically. Furthermore, in the following embodiments, it is needless to say that an element (including an element step etc.) is not necessarily indispensable, except for the case where it is clearly instructed in particular and where it is considered to be clearly indispensable from a theoretical point of view, etc. Similarly, in the following embodiments, when shape, position relationship, etc. of an element etc. are referred to, what resembles or is similar to the shape substantially shall be included, except for the case where it is clearly specified in particular and where it is considered to be clearly not right from a theoretical point of view. This statement also applies to the numeric value and range described above.

In the drawings used in the following embodiments, hatching may be applied even to a plan view to make it easy to see the plan view. Moreover, in the following embodiments, an MISFET (Metal Insulator Semiconductor Field Effect Transistor) representing a field effect transistor is abbreviated as an MIS, a p-channel type MISFET is abbreviated as a pMIS, and an n-channel type MISFET is abbreviated as an nMIS. In the following embodiments, when referring to a wafer, a wafer comprising single-crystal silicon is mainly referred to, but not limited thereto, and an SOI (Silicon On Insulator) wafer, an insulating film substrate for forming an integrated circuit thereover, and the like shall be referred to. The shape of the wafer shall include not only a circle or a substantially circle, but a square, a rectangular, and the like.

In all the drawings for explaining the following embodiments, the same numeral is attached to members having the same function, as a principle, and the repeated explanation thereof is omitted. Hereinafter, the embodiments of the present invention will be described in detail in accordance with the accompanying drawings.

(Embodiment 1)

An example of a CMIS device according to Embodiment 1 is illustrated in FIG. 1. FIG. 1 is a cross-sectional view of a major portion of the CMIS device.

A pMIS is formed in an active region surrounded by an element isolation 2 formed in a major surface of a semiconductor substrate 1 comprising single-crystal silicon, and an n-type well 4 is formed in the active region. The element isolation 2 comprises, for example, an insulating film (e.g., a silicon oxide film) embedded inside a trench.

In the major surface of the semiconductor substrate 1 (n-type well 4) of a pMIS forming region, a gate insulating film 5 comprising, for example, a hafnium (Hf)-based High-k film is formed. Further, over the gate insulating film 5, a gate electrode 6 comprising, for example, a stacked film of a metal compound (e.g., a titanium nitride (TiN) film) 6a and a polysilicon film 6b is formed. In the upper surface of the gate electrode 6, a silicide film 17 is formed. In a sidewall of the gate electrode 6, a sidewall 9 comprising a stacked film of a silicon oxide film 9a and a silicon nitride film 9b is formed.

In the semiconductor substrate 1 (the n-type well 4) on both sides of the gate electrode 6 of the pMIS, a pair of p-type extension regions (a first p-type impurity diffusion layer) 7 having a relatively low-concentration and a pair of p-type diffusion regions (a second p-type impurity diffusion layer) 11 having a relatively high concentration are formed, wherein the source/drain of the pMIS comprises the p-type extension region 7 and the p-type diffusion region 11.

The p-type extension region 7 constituting a part of the source/drain of the pMIS is formed in the n-type well 4 around below the sidewall of the gate electrode 6 by introducing p-type impurities into the n-type well 4. Moreover, the p-type diffusion region 11, which is yet another part of the source/drain of the pMIS and mainly constitutes the source/drain, is formed apart from the sidewall of the gate electrode 6 by a predetermined distance (by the width of the p-type extension region 7) by introducing p-type impurities into the n-type well 4. A silicide film 17 is formed in the upper surface of the p-type diffusion region 11.

An nMIS is formed in an active region surrounded by the element isolation 2 formed in the major surface of the semiconductor substrate 1 comprising single-crystal silicon, and a p-type well 3 is formed in the active region. The element isolation 2 comprises, for example, an insulating film (e.g., a silicon oxide film) embedded inside a trench.

In the major surface of the semiconductor substrate 1 (the p-type well 3) of an nMIS forming region, the gate insulating film 5 comprising, for example, a hafnium-based High-k film is formed. Further, over the gate insulating film 5, the gate electrode 6 comprising, for example, a stacked film of the metal compound (e.g., a titanium nitride (TiN) film) 6a and the polysilicon film 6b is formed. In the upper surface of the gate electrode 6, the silicide film 17 is formed. In the sidewall of the gate electrode 6, the sidewall 9 comprising a stacked film of the silicon oxide film 9a and the silicon nitride film 9b is formed.

In the semiconductor substrate 1 (the p-type well 3) on both sides of the gate electrode 6 of the nMIS, a pair of n-type extension regions (a first n-type impurity diffusion layer) 8 having a relatively low-concentration and a pair of n-type diffusion regions (a second n-type impurity diffusion layer) 13 having a relatively high concentration are formed, wherein the source/drain of the nMIS comprises the n-type extension region 8 and the n-type diffusion region 13.

The n-type extension region 8 constituting a part of the source/drain of the nMIS is formed in the p-type well 3 around below the sidewall of the gate electrode 6 by introducing n-type impurities into the p-type well 3. The depth (the distance in the thickness direction of the semiconductor substrate 1 from the major surface of the semiconductor substrate 1 to a junction (a first junction) between the n-type extension region 8 and the p-type well 3) Le of the n-type extension region 8 is approximately 10 to 20 nm, for example.

The n-type diffusion region 13, which is yet another part of the source/drain of the nMIS and mainly constitutes the source/drain, is formed apart from the sidewall of the gate electrode 6 by a predetermined distance (by the width of the n-type extension region 8) by introducing n-type impurities into the p-type well 3. The depth (the distance in the thickness direction of the semiconductor substrate 1 from the major surface of the semiconductor substrate 1 to a junction (a second junction) between the n-type diffusion region 13 and the p-type well 3) Ld of the n-type diffusion region 13 is approximately 50-80 nm, for example. Moreover, the sheet resistance of the n-type diffusion region 13 is 100 to 200 Ω/sq., and the silicide film 17 is formed in the upper surface thereof.

Furthermore, within the n-type diffusion region 13 and directly under the silicide film 17, a Si:C layer 16 in which a part of the silicon lattice is substituted with carbon is formed. The concentration of the carbon substituting for the silicon is approximately 1 to 2 at %, for example. The depth (the distance in the thickness direction of the semiconductor substrate 1 from the major surface of the semiconductor substrate 1. to a position where the concentration of carbons becomes he maximum) Ls of the Si:C layer 16 is approximately 40 run, and the Si:C layer 16 is surrounded by the n-type diffusion region 13.

In this manner, a tensile stress is applied to the channel of the nMIS by forming the Si:C layer 16 in the n-type diffusion region 13 mainly constituting the source/drain of the nMIS, so that the silicon in the channel can be strained. As a result, the band structure of silicon is modulated and the scattering of electrons between subbands decreases and the effective mass of the electron also decreases, so that the mobility of electrons can be improved.

The sheet resistance of the Si:C layer 16 is 300 Ω/sq., for example, which is higher than the sheet resistance of the n-type diffusion region 13. However, since the Si:C layer 16 is surrounded by the n-type diffusion region 13 and the silicide film 17 is formed in the upper surface of the Si:C layer 16, it can be considered that the effect of the sheet resistance of the Si:C layer 16 on the operating characteristics of the nMIS is minimal.

Furthermore, a silicon nitride film 18 and an interlayer insulating film 19 are formed covering the pMIS and the nMIS. A connecting hole 20 is opened at a predetermined portion of the silicon nitride film 18 and interlayer insulating film 19. Furthermore, a plug 21 is embedded inside the connecting hole 20, and a wiring 22 electrically coupling to the plug 21 is formed in the upper surface of the interlayer insulating film 19.

Next, a method of manufacturing the CMIS device using the strained silicon technique according to Embodiment 1 is described in the order of manufacturing steps using FIGS. 2 to 13. FIGS. 2 to 9 and FIGS. 11 to 13 are cross-sectional views of a major portion of the CMIS device. FIGS. 10A and 10B are cross-sectional views of a major portion of the nMIS for illustrating the ion implantation of cluster carbon and carbon, respectively.

First, as illustrated in FIG. 2, a semiconductor substrate (a flat substantially-circular semiconductor thin plate referred to as a semiconductor wafer) 1 comprising single crystal silicon of p-type, for example, is prepared. Next, a trench with an approximately 0.3 μm depth, for example, is formed in an element isolation region of the semiconductor substrate 1, and the element isolation 2 is formed by embedding an insulating film (e.g., a silicon oxide film) into this trench.

Next, p-type impurities, e.g., boron (B), are ion-implanted into the nMIS forming region of the semiconductor substrate 1 to form the p-type well 3. Similarly, n-type impurities, e.g., phosphorus (P) or arsenic (As), are ion-implanted into the pMIS forming region of the semiconductor substrate 1 to form the n-type well 4.

Next, as shown in FIG. 3, the gate insulating film 5 comprising a High-k film is formed in the major surface of the semiconductor substrate 1. The High-k film is an oxide (e.g., hafnium oxide ($HfO_2$)) containing hafnium, for example. Subsequently, a metal compound 6a, e.g., a titanium nitride film, is deposited onto the gate insulating film 5 by sputtering, and furthermore, a polysilicon film 6b is deposited onto the metal compound 6a by CVD.

Next, the polysilicon film 6b and the metal compound 6a are sequentially etched with a resist pattern as a mask to form the gate electrode 6 of the respective nMIS and pMIS. The height of the gate electrode 6 is approximately 100 nm, for example.

Figure 4:
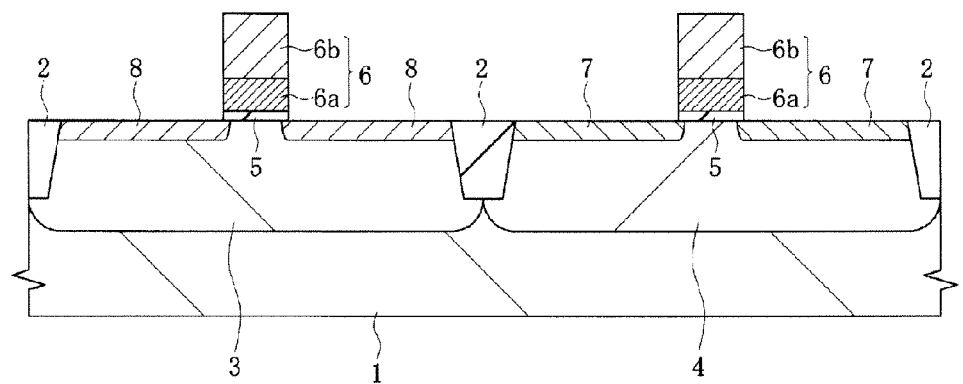
FIG. 4 is a cross-sectional view of the major portion of the same portion as that of FIG. 2 in a manufacturing step of the CMIS device following the manufacturing step of FIG. 3.

Next, as shown in FIG. 4, the nMIS forming region is covered with a resist pattern, and with the gate electrode 6 as a mask, p-type impurities, e.g., boron or boron fluoride ($BF_2$), are ion-implanted into the pMIS forming region of the semiconductor substrate 1 to form a pair of p-type extension regions (the first p-type impurity diffusion layer) 7 in the semiconductor substrate 1 (the n-type well 4) on both sides of the gate electrode 6.

Similarly, the PMIS forming region is covered with a resist pattern, and with the gate electrode 6 as a mask, n-type impurities, e.g., phosphorus or arsenic, are ion-implanted into the nMIS forming region of the semiconductor substrate 1 to form a pair of n-type extension regions (the first n-type impurity diffusion layer) 7 in the semiconductor substrate 1 (the p-type well 3) on both sides of the gate electrode 6.

Figure 5:
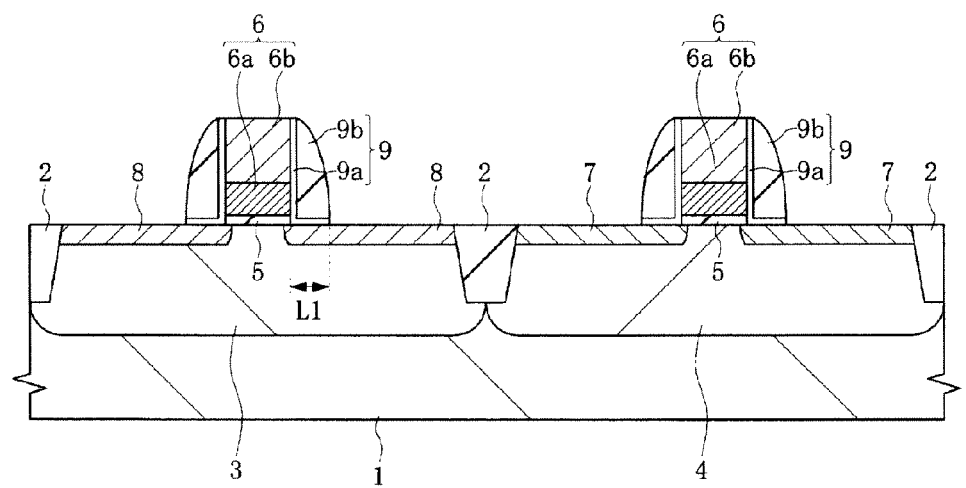
FIG. 5 is a cross-sectional view of the major portion of the same portion as that of FIG. 2 in a manufacturing step of the CMIS device following the manufacturing step of FIG. 4.

Next, as shown in FIG. 5, the silicon oxide film 9a with an approximately 10 nm thickness, for example, is deposited over the major surface of the semiconductor substrate 1, and then the silicon nitride film 9b with an approximately 50 nm thickness, for example, is deposited over the silicon oxide film 9a. Subsequently, the silicon nitride film 9b and the silicon oxide film 9a are sequentially etched by RIE (Reactive Ion Etching) to form the sidewall 9 in the sidewall of the gate electrode 6. The length (sidewall length) L1 of the sidewall 9 is approximately 20 to 40 nm, for example.

Figure 6:
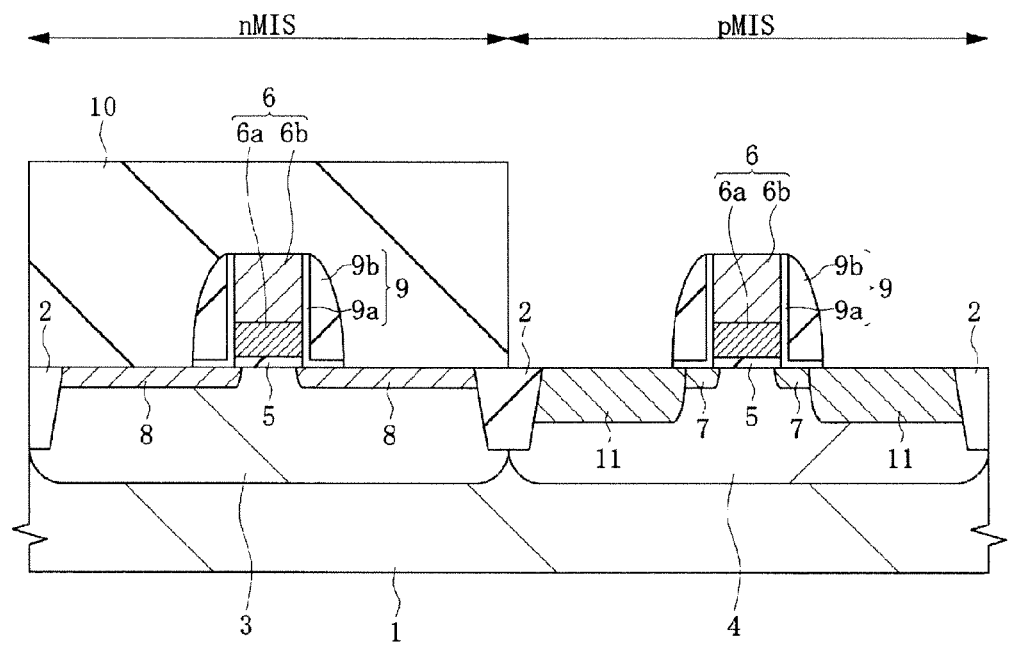
FIG. 6 is a cross-sectional 1 view of the major portion of the same portion as that of FIG. 2 in a manufacturing step of the CMIS device following the manufacturing step of FIG. 5.

Next, as shown in FIG. 6, the nMIS forming region is covered with a resist pattern 10, and with the gate electrode 6 and sidewall 9 as a mask, p-type impurities, e.g., boron or boron fluoride, are ion-implanted into the pMIS forming region of the semiconductor substrate 1 to form a pair of p-type diffusion regions (the second p-type impurity diffusion layer) 11 in the semiconductor substrate 1 (the n-type well 4) on both sides of the sidewall 9.

Figure 7:
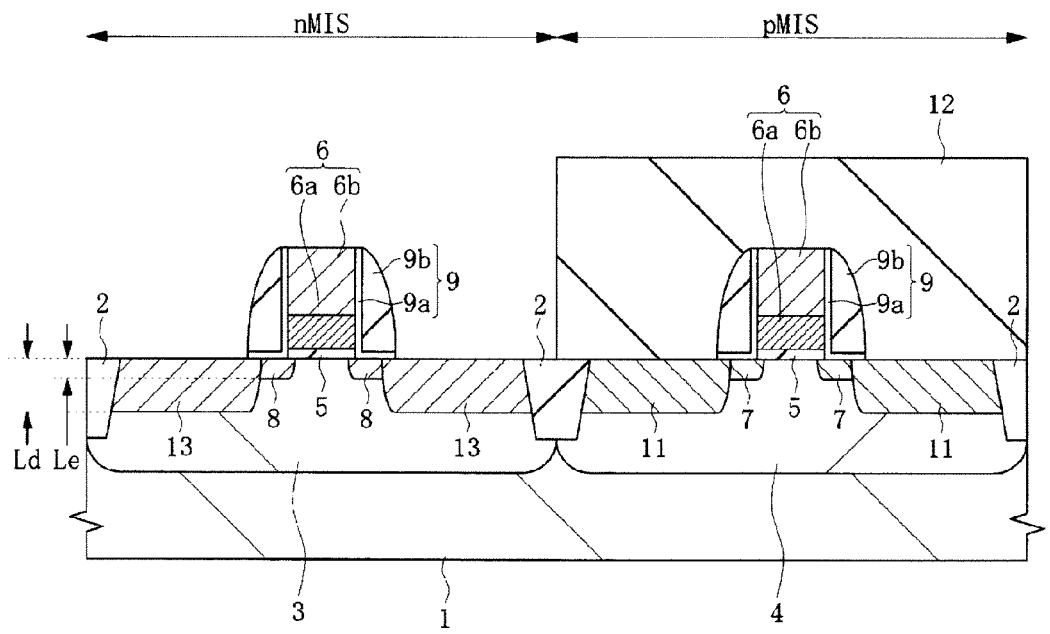
FIG. 7 is a cross-sectional view of the major portion of the same portion as that of FIG. 2 in a manufacturing step of the CHIS device following the manufacturing step of FIG. 6.

Next, as shown in FIG. 7, after removing the resist pattern 10, the pMIS forming region is covered with a resist pattern 12, and with the gate electrode 6 and sidewall 9 as a mask, n-type impurities, e.g., arsenic or phosphorus, are ion-implanted into the nMIS forming region of the semiconductor substrate 1 to form a pair of n-type diffusion regions (the second n-type impurity diffusion layer) 13 in the semiconductor substrate 1 (the p-type well 3) on both sides of the sidewall 9. The implantation quantity and implantation energy in the ion implantation of arsenic are 10 to 30 keV and 1 to $5E15/cm^2$, respectively, while the implantation quantity and implantation energy in the ion implantation of phosphorus are 2 to 10 keV and 3 to $5E15/cm^2$, respectively.

Next, after removing the resist pattern 12, spike annealing (a first heat treatment) at 1000 to 1100° C., for example, is applied to the semiconductor substrate 1 to activate the p-type impurities within the p-type extension region 7 and the p-type diffusion region 11 formed in the pMIS forming region and the n-type impurities within the n-type extension region 8 and the n-type diffusion region 13 formed in the nMIS forming region.

Therefore, the source/drain comprising the p-type extension region 7 and the p-type diffusion region 11, of the pMIS, is formed in the pMIS forming region. Similarly, the source/drain comprising the n-type extension region 8 and the n-type diffusion region 13, of the nMIS, is formed in the nMIS forming region. The depth Le of the n-type extension region 8 formed in the nMIS forming region is approximately 10 to 20 nm, for example, and the depth Ld of the n-type diffusion region 13 is approximately 50 to 80 nm, for example. Moreover, the sheet resistance of the n-type diffusion region 13 is 100 to 200 μ/sq., for example.

Figure 8:
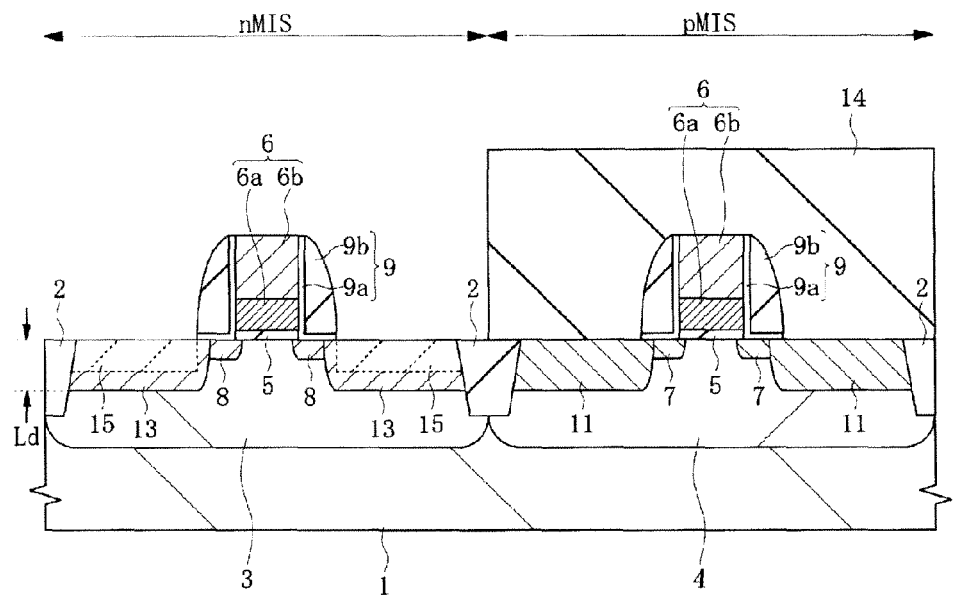
FIG. 8 is a cross-sectional view of the major portion of the same portion as that of FIG. 2 in a manufacturing step of the CMIS device following the manufacturing step of FIG. 7.

Next, as shown in FIG. 8, the pMIS forming region is covered with a resist pattern 14, and with the gate electrode 6 and sidewall 9 as a mask, cluster carbon (e.g., $C_7H_7$) which is a compound of carbon (C) and hydrogen (H) is ion-implanted into the nMIS forming region of the semiconductor substrate 1 to amorphize the semiconductor substrate 1 (p-type well 3) on both sides of the sidewall 9 and form a amorphous layer 15.

In this case, in order not to change the previously formed concentration profile of the n-type diffusion region 13, the above-described cluster carbon is ion-implanted so that the maximum concentration of carbon exists in a region shallower than the depth Ld of the previously formed n-type diffusion region 13. For example, it can be considered that the implantation energy in the ion implantation of the cluster carbon in a range of 6 to 10 keV per carbon atom and the implantation quantity in a range of 1 to $5E15/cm^2$ are preferable (but not limited to these ranges depending on the other conditions, of course), and furthermore a range with the center value of 3E15/cm² is the most preferable.

Since the pMIS forming region is covered with the resist pattern 14, the semiconductor substrate 1 (the n-type well 4) on both sides of the sidewall 9 is not amorphized.

Figure 9:
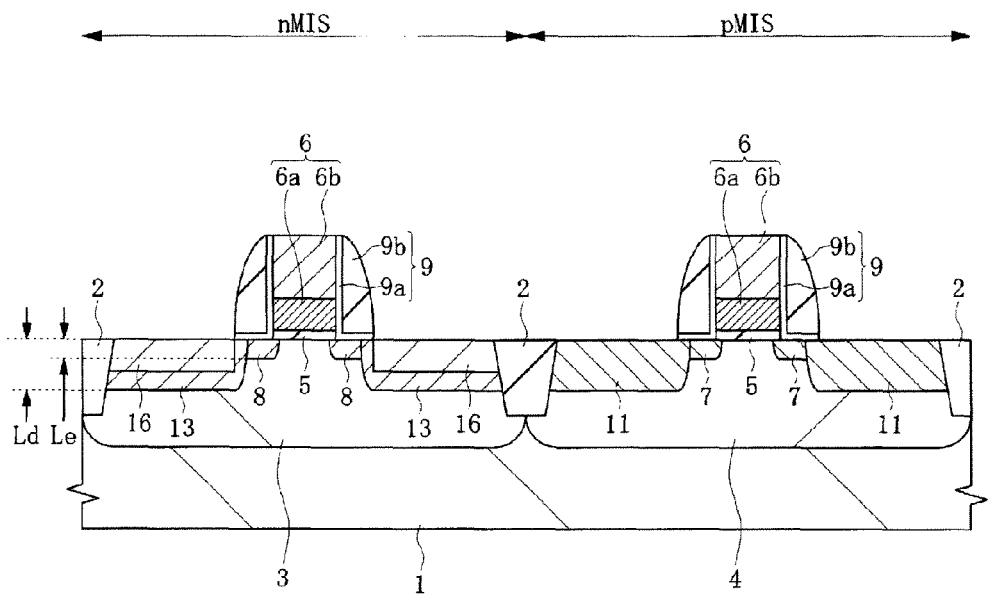
FIG. 9 is a cross-sectional view of the major portion of the same portion as that of FIG. 2 in a manufacturing step of the CMIS device following the manufacturing step of FIG. 8.

Next, as shown in FIG. 9, by applying a heat treatment (a second heat treatment) to the semiconductor substrate 1, the amorphous layer 15 is recrystallized to form the Si:C layer 16 in which a part of the silicon lattice is substituted with carbon. The concentration of the carbon substituting for the silicon is approximately 1 to 2 at %, for example, and the sheet resistance of the Si:C layer 16 becomes 300 Ω/sq., for example. This heat treatment is performed by LSA or FLA, for example, and for the temperature of the heat treatment, it can be considered that a range of 1100 to 1350° C., for example, is preferable (but not limited to this range depending on the other conditions, of course) and furthermore, a range with the center value of 1200° C. is the most preferable. Moreover, it can be considered that the time for the heat treatment is preferably equal to or less than 1 millisecond, e.g., a range of 0.25 to 0.8 milliseconds. As described above, this heat treatment is performed at high temperature of 1100 to 1350° C., for example. However, since this heat treatment is performed in a short time of 0.25 to 0.8 milliseconds, for example, and also the p-type impurities within the p-type extension region 7 and the p-type diffusion region 11 constituting the source/drain of the pMIS are already activated, a change in the impurity concentration profile of the respective p-type extension region 7 and p-type diffusion region 11 constituting the source/drain of the pMIS can be suppressed.

With the ion implantation of the cluster carbon and the subsequent heat treatment, the Si:C layer 16, in which the maximum concentration of carbon exists at an approximately 40 nm, for example, from the major surface of the semiconductor substrate 1, is formed within the n-type diffusion region 13. That is, the Si:C layer 16 is formed so that the maximum concentration of carbon exists between the depth Le of the n-type extension region 8 and the depth Ld of the n-type diffusion region 13.

The sheet resistance of the Si:C layer 16 becomes higher than the sheet resistance of the n-type diffusion region 13. However, since the Si:C layer 16 is surrounded by the n-type diffusion region 13 and also in the subsequent steps, the silicide film 17 is formed in the upper surface of the Si:C layer 16, the effect of the sheet resistance of the Si:C layer 16 on the operating characteristics of the nMIS is minimal.

As illustrated in FIG. 10B, if only carbon is ion-implanted, the depth of the Si:C layer 16 becomes non-uniform because tetravalent carbon is likely to cause channeling. However, if cluster carbon is ion-implanted, then the depth of the Si:C layer 16 becomes uniform as illustrated in FIG. 10A because it is unlikely to cause channeling. As a result, the Si:C layer 16 with a desired depth can be formed. Accordingly, in the case where cluster carbon is used, the control of the depth of the Si:C layer 16 is easy as compared with the case where only carbon is used, and thus a variation in the operating characteristics of the nMIS due to the formation of the Si:C layer 16 can be prevented.

Moreover, the cluster carbon is heavier than tetravalent carbon, and therefore in the case where cluster carbon is used, the amorphous layer can be easily formed and furthermore the time for ion implantation becomes short (about ⅕) as compared with the case where only carbon is used. As a result, the productivity can be improved.

Next, as shown in FIG. 11, the silicide film 17 is selectively formed in the upper surface of the gate electrode 6 (the polysilicon film 6b) and the p-type diffusion region 11 of the pMIS and in the upper surface of the gate electrode 6 (polysilicon film 6b) and n-type diffusion region 13 of the nMIS, respectively. The silicide film 17 is a nickel (Ni) silicide film or a cobalt (Co) silicide film, for example.

Figure 12:
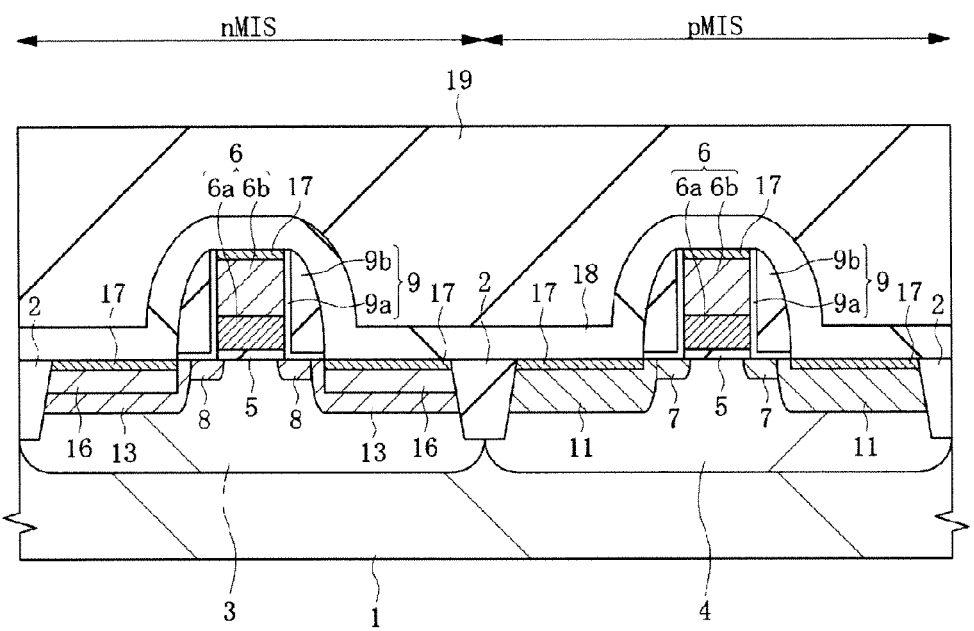
FIG. 12 is a cross-sectional view of the major portion of the same portion as that of FIG. 2 in a manufacturing step of the CMIS device following the manufacturing step of FIG. 11.

Next, as shown in FIG. 12, the silicon nitride film 18 and the interlayer insulating film 19 are sequentially formed over the major surface of the semiconductor substrate 1. The interlayer insulating film 19 is a TEOS ($Si(OC_2H_5)_4$) film, a silicon oxynitride film, or a silicon oxide film, for example. Subsequently, the interlayer insulating film 19 is polished by CMP to planarize the surface thereof.

Figure 13:
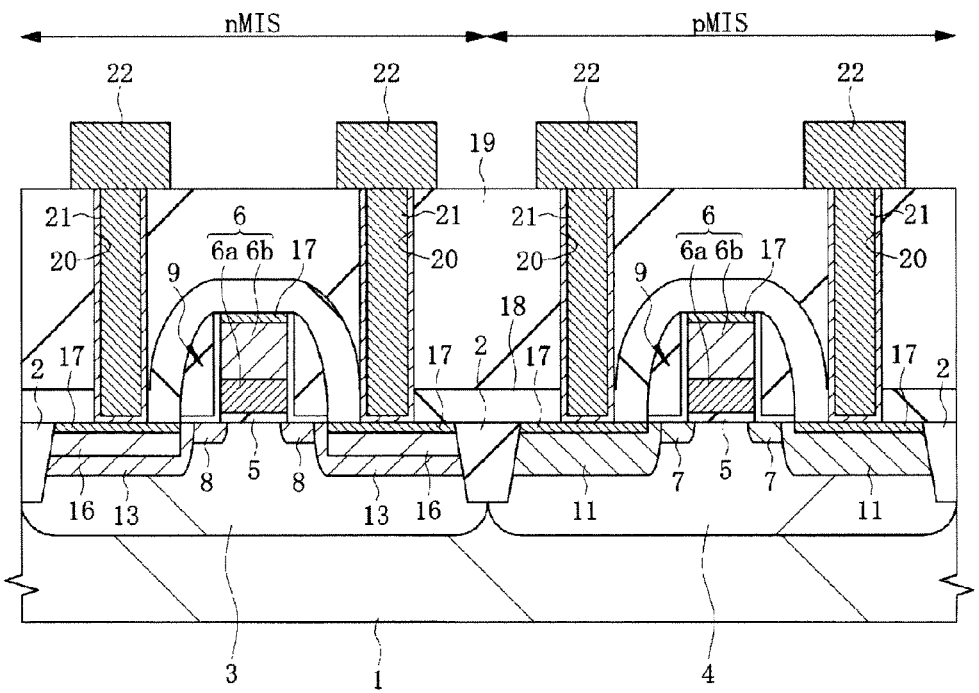
FIG. 13 is a cross-sectional view of the major portion of the same portion as that of FIG. 2 in a manufacturing step of the CMIS device following the manufacturing step of FIG. 12.

Next, as shown in FIG. 13, by dry etching with a resist pattern as a mask, the connecting hole 20 is formed at a predetermined portion of the silicon nitride film 18 and interlayer insulating film 19. Subsequently, a barrier metal film (e.g., a titanium nitride film) and a metal film (e.g., a tungsten (W) film) are sequentially deposited over the major surface of the semiconductor substrate 1 including the inside of the connecting hole 20, and subsequently the barrier metal film and the metal film are polished by CMP, and then the barrier metal film and the metal film are embedded inside the connecting hole 20 to form the plug 21. The barrier metal film has a function to prevent the metal film from diffusing into the semiconductor substrate 1.

Subsequently, a metal film (e.g., an aluminum (Al) film or a copper (Cu) film) is deposited over the major surface of the semiconductor substrate 1, and then by dry etching with a resist pattern as a mask, the metal film is processed to form the wiring 22. With the above-described manufacturing steps, the CMIS device according to Embodiment 1 is almost completed.

In this manner, according to Embodiment 1, a tensile stress is applied to the channel of the nMIS by forming the Si:C layer 16 in the n-type diffusion region 13 mainly constituting the source/drain of the nMIS, and thus the silicon in the channel can be strained. As a result, the mobility of electrons can be improved.

Furthermore, the step of forming the source/drain (the n-type extension region 8 and the n-type diffusion region 13) of the nMIS, the source/drain having a desired concentration profile and resistance, and the step of forming the Si:C layer 16 having a desired amount of strain in the n-type diffusion region 13 are performed separately. Therefore, both the optimization of the parasitic resistance of the source/drain of the nMIS and the optimization of the amount of strain in the Si:C layer 16 can be achieved.

Moreover, after forming the source/drain of the pMIS (the p-type extension region 7 and the p-type diffusion region 11), a heat treatment at high temperature (e.g., 1100 to 1350° C.) for forming the Si:C layer 16 having a desired amount of strain is performed. However, because this heat treatment is performed in a short time of 0.25 to 0.8 milliseconds, for example, and the p-type impurities within the p-type extension region 7 and the p-type diffusion region 11 constituting the source/drain of the pMIS are already activated, a change in the impurity concentration profile of the respective p-type extension region 7 and p-type diffusion region 11 constituting the source/drain of the pMIS can be suppressed. Therefore, the source/drain having a shallow junction of the pMIS can be formed.

These allow the improvement of the operating characteristics of the nMIS, which are formed using the strained silicon technique, without degrading the operating characteristics of the pMIS, in the CMIS device.

(Embodiment 2)

While an nMIS according to Embodiment 2 has substantially the same structure as the nMIS according to Embodiment 1 described above, a pMIS according to Embodiment 2 has a different structure from the pMIS according to Embodiment 1 described above.

Figure 14:
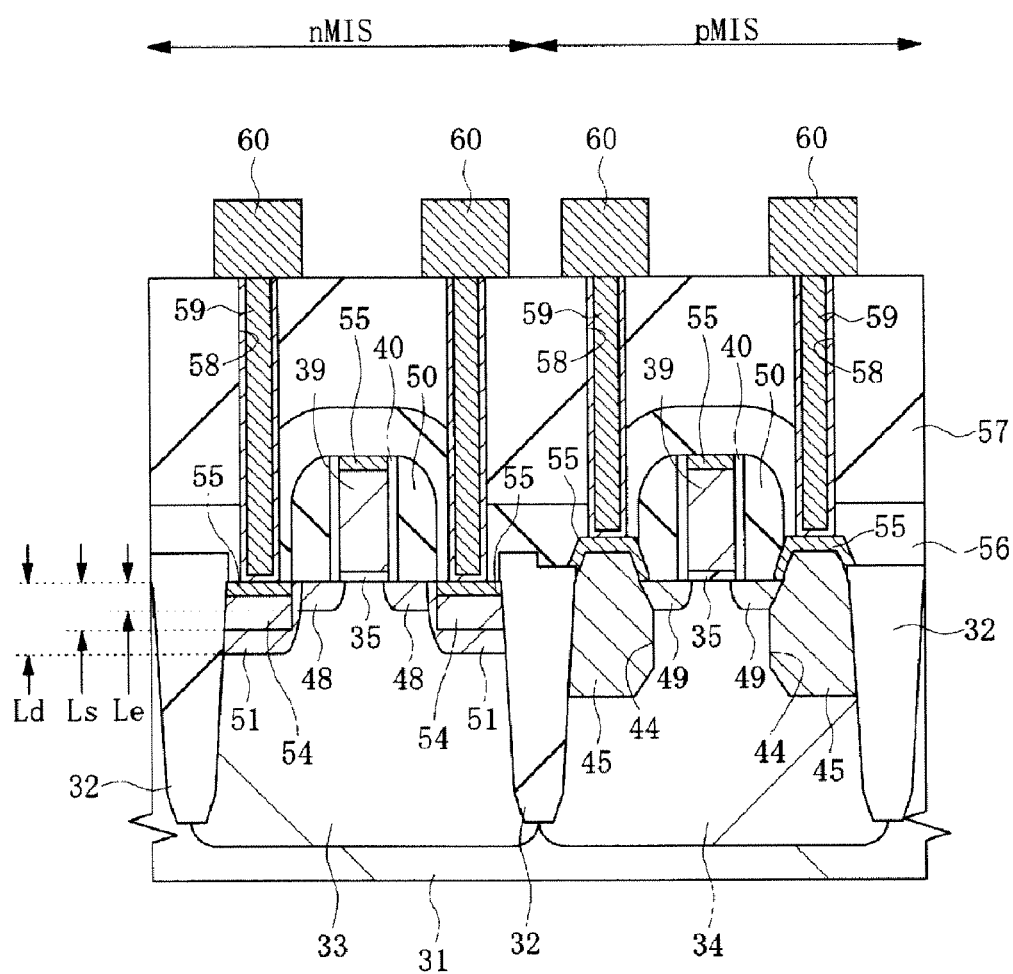
FIG. 14 is a cross-sectional view of a major portion of a CMIS device according to Embodiment 2 of the present invention.

An example of a CMIS device according to Embodiment 2 is illustrated in FIG. 14. FIG. 14 is a cross-sectional view of a major portion of the CMIS device.

The pMIS is formed in an active region surrounded by an element isolation 32 formed in a major surface of a semiconductor substrate 31 comprising single-crystal silicon, and an n-type well 34 is formed in the active region. The element isolation 32 comprises, for example, an insulating film (e.g., a silicon oxide film) embedded inside a trench.

In the major surface of the semiconductor substrate 31 of a pMIS forming region (an n-type well 34), a gate insulating film 35 comprising, for example, a silicon oxide film or a silicon oxynitride film is formed. Further, over the gate insulating film 35, a gate electrode 39 comprising a polysilicon film is formed. The gate length of the gate electrode 39 is approximately 50 nm, for example, and in the upper surface thereof, a silicide film 55 is formed. A sidewall 50 comprising a silicon nitride film is formed in a sidewall of the gate electrode 39.

In the semiconductor substrate 31 (the n-type well 34) on both sides of the gate electrode 39 of the pMIS, a pair of p-type extension regions (a first p-type impurity diffusion layer) 49 having a relatively low-concentration and a pair of p-type diffusion regions (a second p-type impurity diffusion layer) 45 having a relatively high concentration are formed, wherein the source/drain of the pMIS comprises the p-type extension region 49 and the p-type diffusion region 45. However, this source/drain has a structure (an elevated source/drain structure) in which the major surface of the semiconductor substrate 31 is elevated from the initial major surface thereof.

The p-type extension region 49 constituting a part of the source/drain of the pMIS is formed in the n-type well 34 around below the sidewall of the gate electrode 39 by introducing p-type impurities into the semiconductor substrate 31 (the n-type well 34). Moreover, the p-type diffusion region 45, which is a yet another part of the source/drain of pMIS and mainly constitutes the source/drain, is formed apart from the sidewall of the gate electrode 39 by a predetermined distance (by the width of the p-type extension region 49) by introducing p-type impurities into a silicon germanium (SiGe) layer formed on both sides of the gate electrode 39. The silicide film 55 is formed in the upper surface of the p-type diffusion region 45.

A groove 44 is formed in the active region of the semiconductor substrate 31, apart from the sidewall of the gate electrode 39 by a predetermined distance. Then, the silicon germanium layer, into which p-type impurities are introduced, to serve as the p-type diffusion region 45 is selectively formed being further elevated from the inside of the groove 44 and the initial major surface of the semiconductor substrate 31 by epitaxial growth. The thickness of the silicon germanium layer is approximately 40 to 100 nm, for example.

In this manner, the p-type diffusion region 45 mainly constituting the source/drain of the pMIS is formed from the silicon germanium layer into which p-type impurities are introduced, and thus a compression stress is applied to the channel of the pMIS because the lattice constant of silicon germanium is larger than the lattice constant of silicon, and the silicon in the channel can be strained. As a result, the band structure of silicon is modulated and the scattering of holes between subbands is reduced and the effective mass of the hole is also reduced and therefore the mobility of holes can be improved.

An nMIS is formed in an active region surrounded by the element isolation 32 formed in the major surface of the semiconductor substrate 31 comprising single-crystal silicon, and a p-type well 33 is formed in the active region. The element isolation 32 comprises, for example, an insulating film (e.g., a silicon oxide film) embedded inside a trench.

In the major surface of the semiconductor substrate 31 of the nMIS forming region (the p-type well 33), the gate insulating film 35 comprising, for example, a silicon oxide film or a silicon oxynitride film is formed. Further, over the gate insulating film 5, the gate electrode 39 comprising a polysilicon film is formed. The gate length of the gate electrode 39 is approximately 50 nm, for example, and in the upper surface thereof, the silicide film 55 is formed. The sidewall 50 comprising a silicon nitride film is formed in the sidewall of the gate electrode 39.

In the semiconductor substrate 31 (the p-type well 33) on both sides of the gate electrode 39 of the nMIS, a pair of n-type extension regions (a first n-type impurity diffusion layer) 48 having a relatively low-concentration and a pair of n-type diffusion regions (a second n-type impurity diffusion layer) 51 having a relatively high concentration are formed, wherein the source/drain of the nMIS comprises the n-type extension region 48 and the n-type diffusion region 51.

The n-type extension region 48 constituting a part of the source/drain of the nMIS is formed in the p-type well 33 around below the sidewall of the gate electrode 39 by introducing n-type impurities into the semiconductor substrate 31 (the p-type well 33). The depth Le of the n-type extension region 48 is approximately 10 to 20 nm, for example.

The n-type diffusion region 51, which is yet another part of the source/drain of the nMIS and mainly constitutes the source/drain, is formed apart from the sidewall of the gate electrode 39 by a predetermined distance (by the width of the n-type extension region 48) by introducing n-type impurities into the semiconductor substrate 31 (the p-type well 33). The depth Ld of the n-type diffusion region 51 is approximately 50 to 80 nm, for example. Moreover, the sheet resistance of the n-type diffusion region 51 is 100 to 200 Ω/sq., and the silicide film 55 is formed in the upper surface thereof.

Furthermore, within the n-type diffusion region 51 and directly under the silicide film 55, a Si:C layer 54 in which a part of the silicon lattice is substituted with carbon is formed. The concentration of the carbon substituting for the silicon is approximately 1 to 2 at %, for example. The depth Ls of the Si:C layer 54 is approximately 40 nm, for example, and the Si:C layer 54 is surrounded by the n-type diffusion region 51.

In this manner, a tensile stress is applied to the channel of the nMIS by forming the Si:C layer 54 in the n-type diffusion region 51 mainly constituting the source/drain of the nMIS, and thus the silicon in the channel can be strained. As a result, the band structure of silicon is modulated and the scattering of electrons between subbands is reduced and the effective mass of the electron is also reduced and therefore the mobility of electrons can be improved.

Furthermore, a silicon nitride film 56 and an interlayer insulating film 57 are formed covering the pMIS and the nMIS. A connecting hole 58 is opened at a predetermined portion of the silicon nitride film 56 and the interlayer insulating film 57. Furthermore, a plug 59 is embedded inside the connecting hole 58, and a wiring 60 electrically coupling to the plug 59 is formed in the upper surface of the interlayer insulating film 57.

A method of manufacturing the CMIS device using a strained silicon technique according to Embodiment 2 is described in the order of manufacturing steps using FIGS. 15 to 32. FIGS. 15 to 32 are cross-sectional views of a major portion of the CMIS device.

Figure 15:
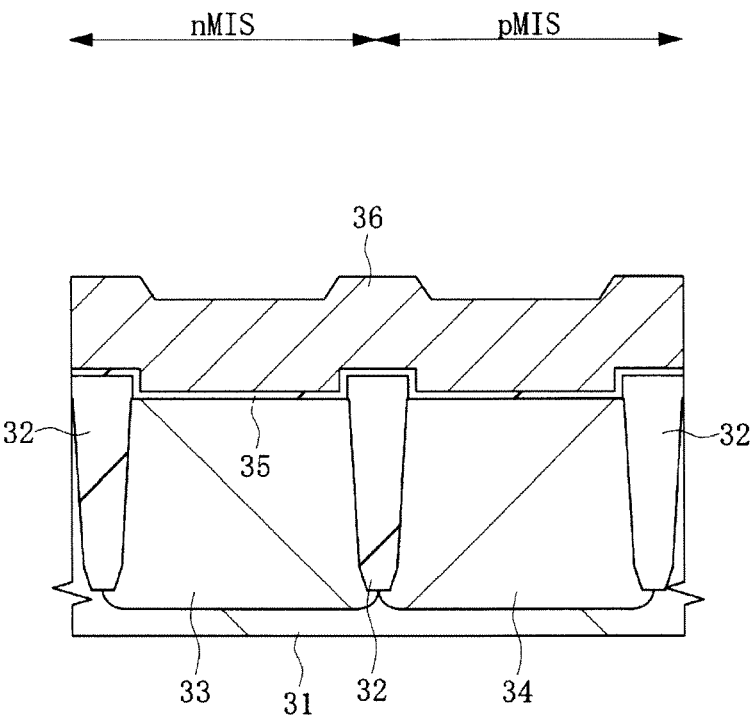
FIG. 15 is a cross-sectional view of the major portion showing a manufacturing step of the CMIS device according to Embodiment 2 of the present invention.

First, as shown in FIG. 15, a semiconductor substrate (a flat substantially-circular semiconductor thin plate referred to as a semiconductor wafer) 31 comprising, for example, single crystal silicon of p-type is prepared. Next, a trench with an approximately 0.3 μm depth, for example, is formed in an element isolation region of the semiconductor substrate 31, and an element isolation 32 is formed by embedding an insulating film (e.g., a silicon oxide film) into this trench.

Next, p-type impurities, e.g., boron, are ion-implanted into the nMIS forming region of the semiconductor substrate 31 to form the p-type well 33. Similarly, n-type impurities, e.g., phosphorus or arsenic, are ion-implanted into the pMIS forming region of the semiconductor substrate 31 to form the n-type well 34.

Next, the surface of the semiconductor substrate 31 is washed by wet etching using a fluoric acid (HF) solution, for example, and then the gate insulating film 35 is formed in the major surface of the semiconductor substrate 31. Subsequently, a polysilicon film 36 is deposited onto the gate insulating film 35 by CVD. The thickness of the polysilicon film 36 is approximately 100 to 140 nm, for example.

Figure 16:
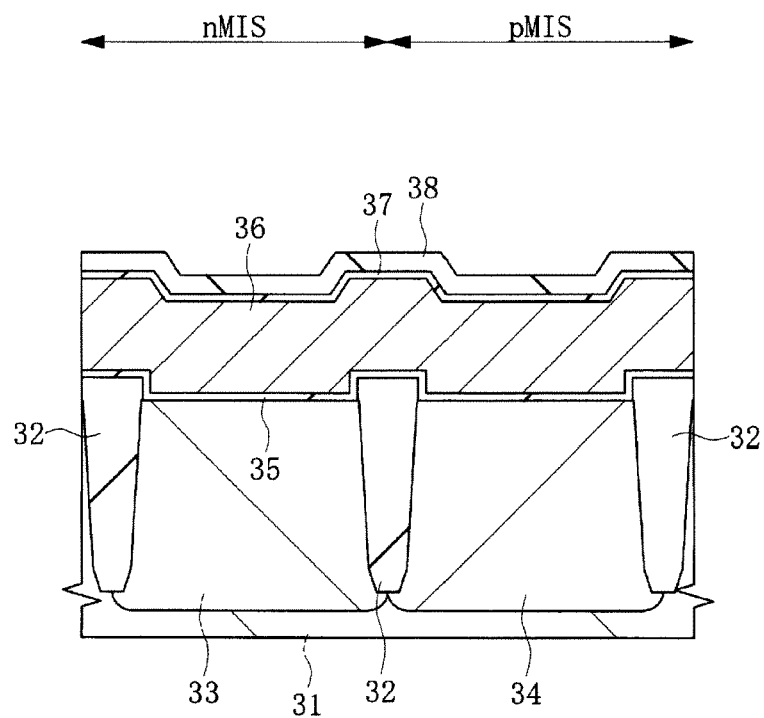
FIG. 16 is a cross-sectional view of the major portion of the same portion as that of FIG. 15 in a manufacturing step of the CMIS device following the manufacturing step of FIG. 15.

Next, as shown in FIG. 16, the silicon oxide film 37 and the silicon nitride film 38 are sequentially deposited onto the polysilicon film 36. The thickness of the silicon oxide film 37 is approximately 2 to 8 nm, for example, and the thickness of the silicon nitride film 38 is approximately 10 to 60 nm.

Figure 17:
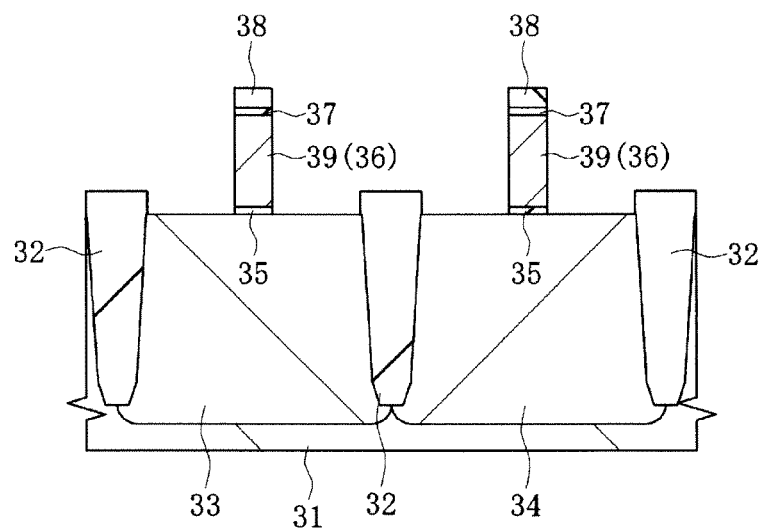
FIG. 17 is a cross-sectional view of the major portion of the same portion as that of FIG. 15 in a manufacturing step of the CMIS device following the manufacturing step of FIG. 16.

Next, as shown in FIG. 17, by dry etching with a resist pattern as a mask, the silicon nitride film 38, the silicon oxide film 37, and the polysilicon film 36 are sequentially etched to form the gate electrode 39 of the pMIS and the gate electrode 39 of the nMIS, the both gate electrodes comprising the polysilicon film 36.

Figure 18:
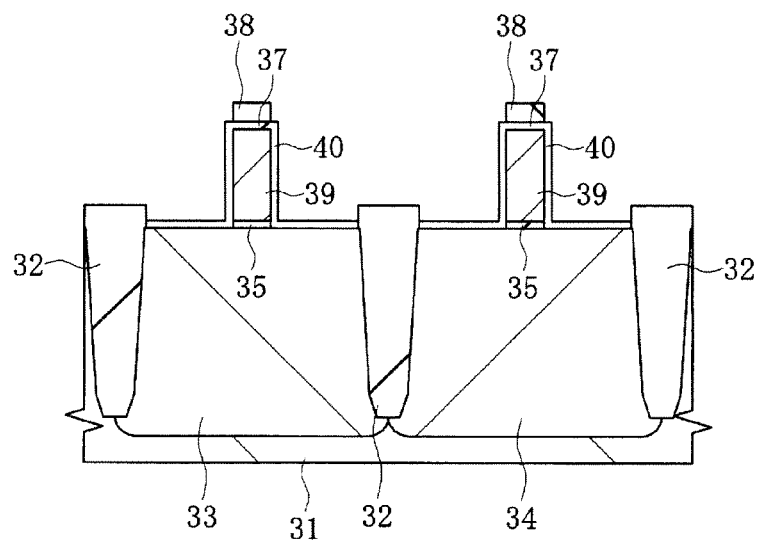
FIG. 18 is a cross-sectional view of the major portion of the same portion as that of FIG. 15 in a manufacturing step of the CMIS device following the manufacturing step of FIG. 17.

Next, as shown in FIG. 18, the semiconductor substrate 31 is thermally oxidized to form a silicon oxide film 40 with an approximately 4 to 20 nm thickness in the exposed major surface (over the p-type well 33 and n-type well 34) of the semiconductor substrate 31 and in the exposed surface of the gate electrode 39.

Figure 19:
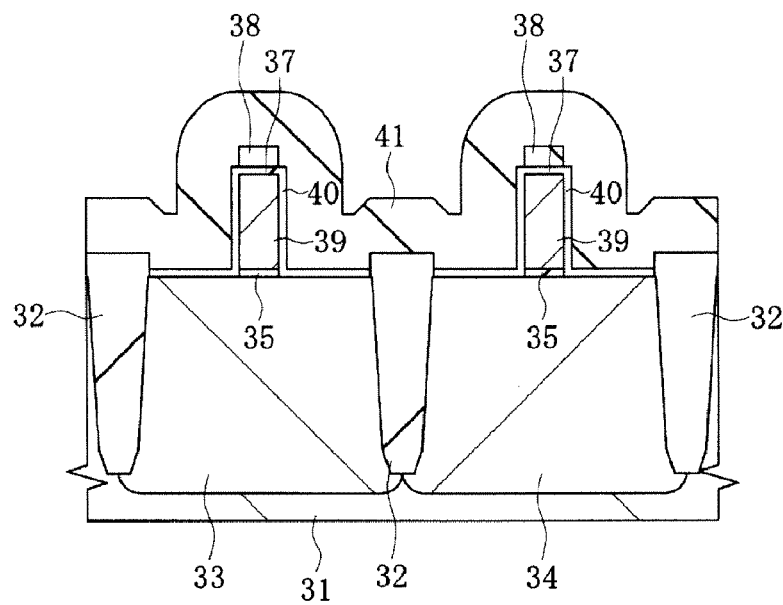
FIG. 19 is a cross-sectional view of the major portion of the same portion as that of FIG. 15 in a manufacturing step of the CMIS device following the manufacturing step of FIG. 18.

Next, as shown in FIG. 19, a silicon nitride film 41 is deposited over the major surface of the semiconductor substrate 31. The thickness of the silicon nitride film 41 is approximately 50 nm, for example.

Figure 20:
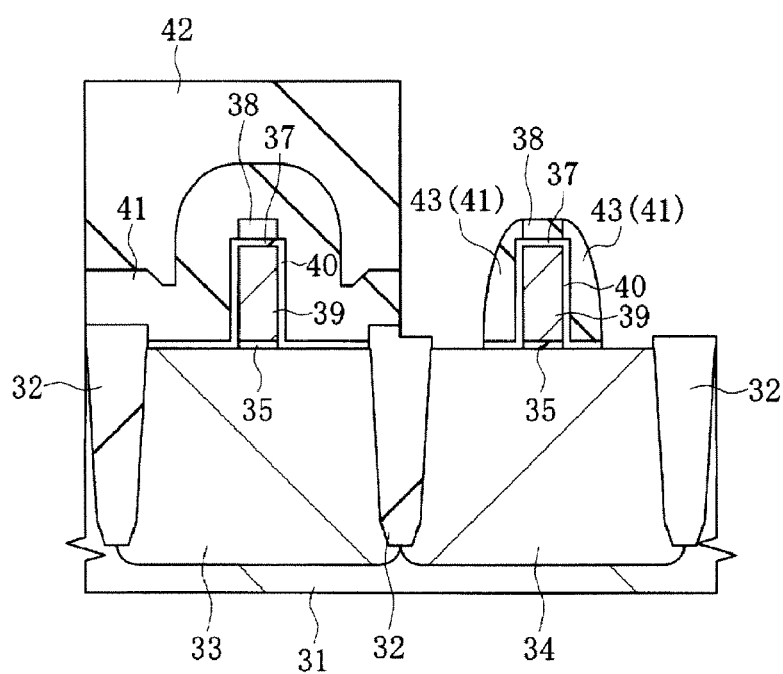
FIG. 20 is a cross-sectional view of the major portion of the same portion as that of FIG. 15 in a manufacturing step of the CMIS device following the manufacturing step of FIG. 19.

Next, as shown in FIG. 20, the nMIS forming region is covered with a resist pattern 42, and the silicon nitride film 41 and the silicon oxide film 40 are etched by RIE to form a sidewall 43 in the sidewall of the gate electrode 39 of the pMIS.

Figure 21:
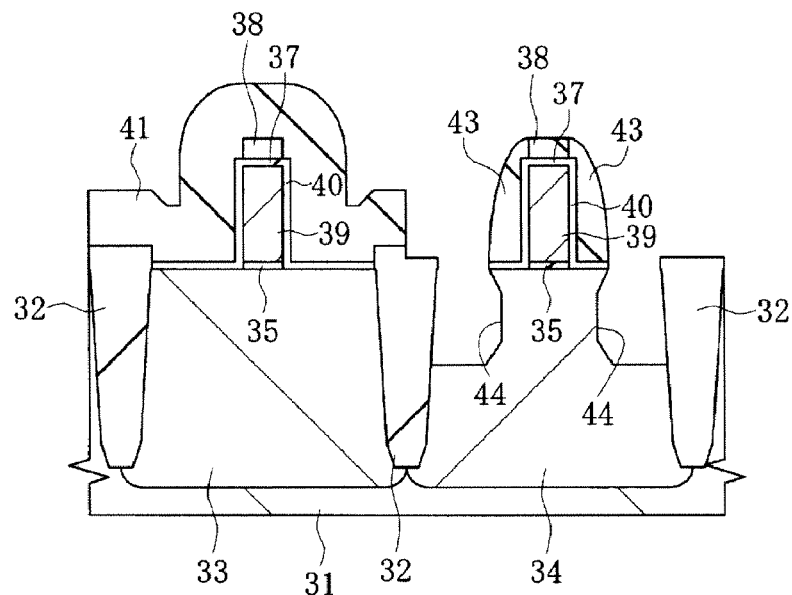
FIG. 21 is a cross-sectional view of the major portion of the same portion as that of FIG. 15 in a manufacturing step of the CMIS device following the manufacturing step of FIG. 20.

Next, as shown in FIG. 21, after removing the resist pattern 42, the semiconductor substrate 31 in a region, in which the source/drain of the pMIS is formed, is processed by wet etching to from the groove (substrate recess) 44. It should be noted that, although wet etching is used here in forming the groove 44, dry etching can also be used. The use of wet etching has an advantage of no damage to the semiconductor substrate 31, but the size control of the groove 44 is difficult because side etching proceeds to the region under the gate electrode 39. In contrast, the use of dry etching has an advantage that the above-described side etching is suppressed and the size control of the groove 44 is easy, but causes damage to the semiconductor substrate 31.

Figure 22:
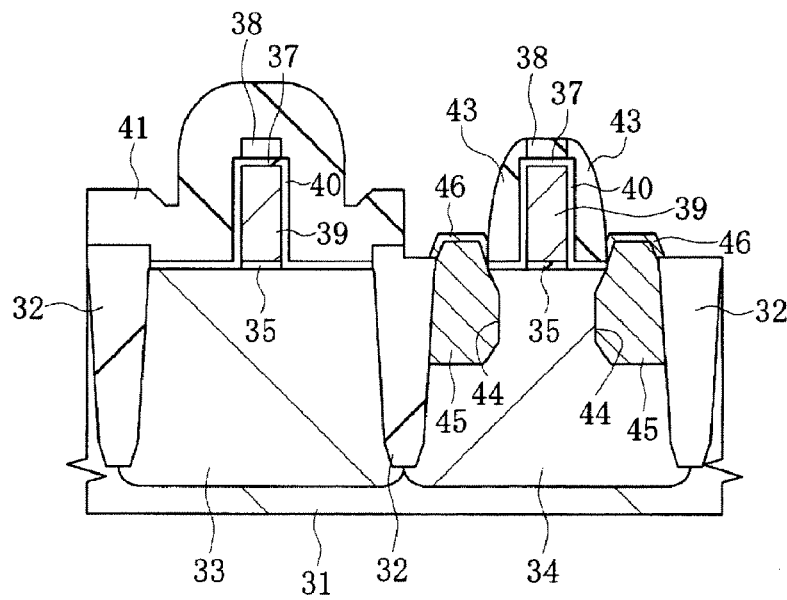
FIG. 22 is a cross-sectional view of the major portion of the same portion as that of FIG. 15 in a manufacturing step of the CMIS device following the manufacturing step of FIG. 21.

Next, as shown in FIG. 22, the silicon germanium layer, into which p-type impurities are introduced, is selectively formed being further elevated from the inside of the groove 44 and the initial major surface (the major surface of the semiconductor substrate 31 before forming the groove 44) of the semiconductor substrate 31 by epitaxial growth, and further a silicon layer 46 is formed over the silicon germanium layer. This silicon germanium layer into which p-type impurities are introduced serves as the p-type diffusion region (the second p-type impurity diffusion layer) 45. The silicon germanium layer is formed by epitaxial growth using gases, such as DCS (Dichlorosilane: $SiH_2Cl_2$), germane ($GeH_4$), hydrochloric acid (HCl), and diborane ($B_2H_6$), for example. The thickness of the silicon germanium layer is approximately 40 to 100 nm, for example, and the thickness of the silicon layer 46 is approximately 5 to 20 nm.

Here, the silicon germanium layer is formed being elevated from the initial major surface of the semiconductor substrate 31, but not limited thereto, and the silicon germanium layer may be formed up to the substantially the same height as the initial major surface of the semiconductor substrate 31 (until the inside of the groove 44 is filled).

Since a strong compression stress is applied to the channel of the pMIS by employing the silicon germanium layer in the source/drain of the pMIS, the mobility of holes can be improved and the operation speed of the pMIS can be improved.

Figure 23:
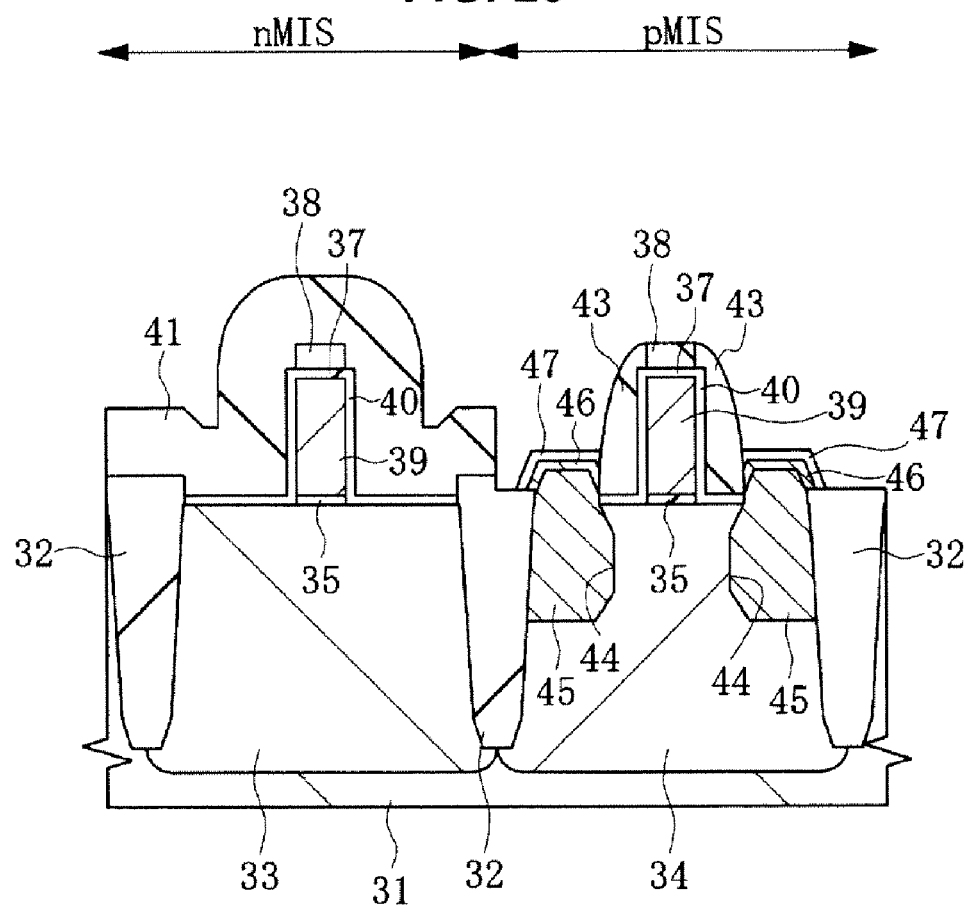
FIG. 23 is a cross-sectional view of the major portion of the same portion as that of FIG. 15 in a manufacturing step of the CMIS device following the manufacturing step of FIG. 22.

Next, as shown in FIG. 23, the semiconductor substrate 31 is thermally oxidized to forma silicon oxide film 47 with an approximately 1 to 4 nm thickness, for example, in the upper surface of the silicon layer 46.

Figure 24:
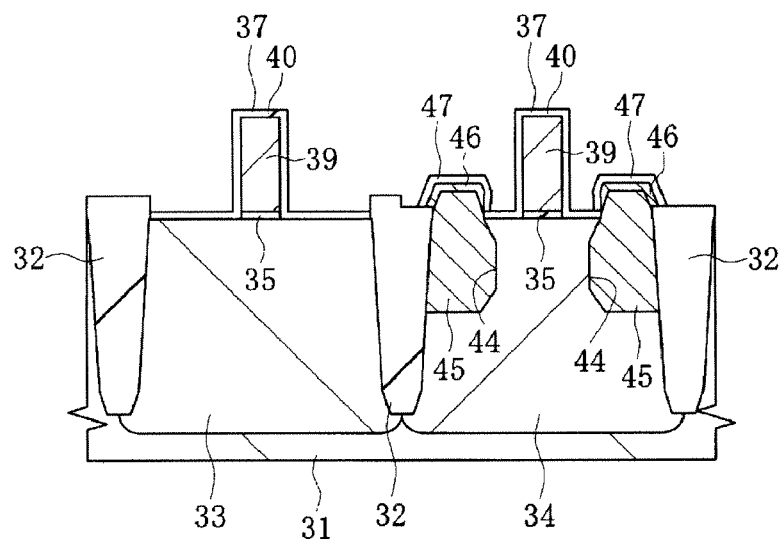
FIG. 24 is a cross-sectional view of the major portion of the same portion as that of FIG. 15 in a manufacturing step of the CMIS device following the manufacturing step of FIG. 23.

Next, as shown in FIG. 24, the silicon nitride films 38, 41 are removed using heated phosphoric acid.

Figure 25:
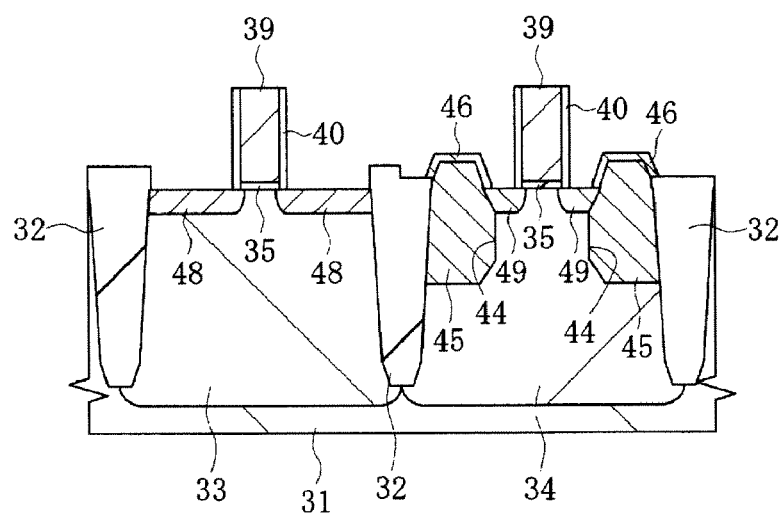
FIG. 25 is a cross-sectional view of the major portion of the same portion as that of FIG. 15 in a manufacturing step of the CMIS device following the manufacturing step of FIG. 24.

Next, as shown in FIG. 25, the pMIS forming region is covered with a resist pattern, and with the gate electrode 39 as a mask, n-type impurities, e.g., phosphorus or arsenic, are ion-implanted into the nMIS forming region of the semiconductor substrate 31 to form a pair of n-type extension regions 48 (the first n-type impurity diffusion layer) in the semiconductor substrate 31 (the p-type well 33) on both sides of the gate electrode 39. Similarly, the nMIS forming region is covered with a resist pattern, and with the gate electrode 39 as a mask, p-type impurities, e.g., boron or fluoridation, are ion-implanted into the pMIS forming region of the semiconductor substrate 31 to form a pair of p-type extension region 49 (the first p-type impurity diffusion layer) in the semiconductor substrate 31 (the n-type well 34) on both sides of the gate electrode 39.

Figure 26:
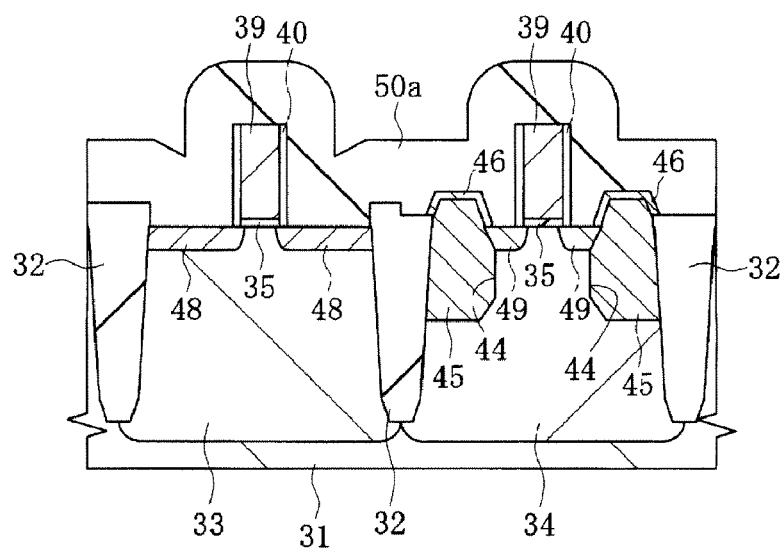
FIG. 26 is a cross-sectional view of the major portion of the same portion as that of FIG. 15 in a manufacturing step of the CMIS device following the manufacturing step of FIG. 25.

Next, as shown in FIG. 26, a silicon nitride film 50a is deposited onto the major surface of the semiconductor substrate 31.

Figure 27:
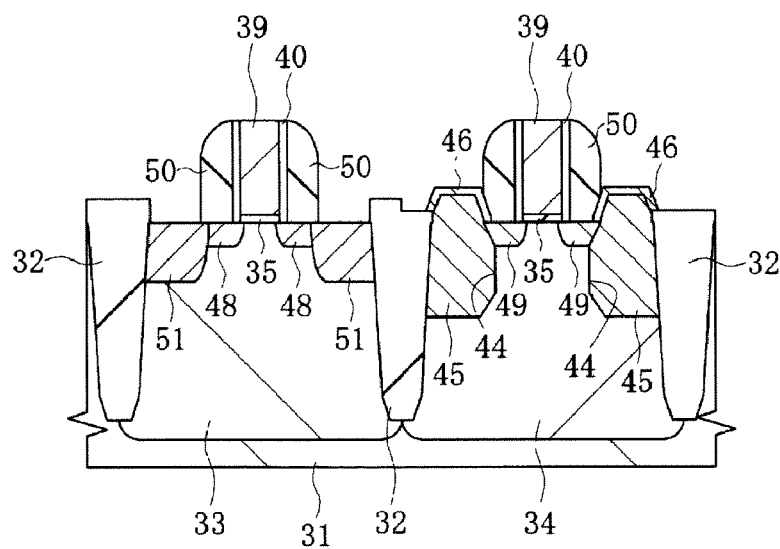
FIG. 27 is a cross-sectional view of the major portion of the same portion as that of FIG. 15 in a manufacturing step of the CMIS device following the manufacturing step of FIG. 26.

Next, as shown in FIG. 27, the silicon nitride film 50a is etched by RIE to form the sidewall 50 in the sidewall of the gate electrode 39. Subsequently, the pMIS forming region is covered with a resist pattern, and with the gate electrode 39 and sidewall 50 as a mask, n-type impurities, e.g., phosphorus or arsenic, are ion-implanted into the nMIS forming region of the semiconductor substrate 31 to form a pair of n-type diffusion regions 51 (the second n-type impurity diffusion layer) in the semiconductor substrate 31 (the p-type well 33) on both sides of the sidewall 50.

Next, spike annealing (the first heat treatment) at 1000 to 1100° C., for example, is applied to the semiconductor substrate 31 to activate the p-type impurities within the p-type extension region 49 and p-type diffusion region 45 formed in the pMIS forming region and the n-type impurities within the n-type extension region 48 and n-type diffusion region 51 formed in the nMIS forming region. Thus, the source/drain comprising the p-type extension region 49 and p-type diffusion region 45 of the pMIS is formed in the pMIS forming region. Similarly, the source/drain comprising the n-type extension region 48 and n-type diffusion region 51 of the nMIS is formed in the nMIS forming region.

Figure 28:
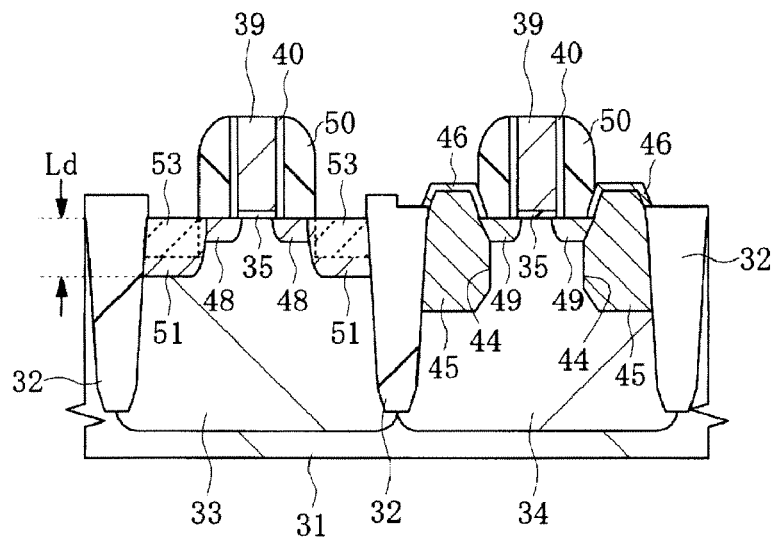
FIG. 28 is a cross-sectional view of the major portion of the same portion as that of FIG. 15 in a manufacturing step of the CMIS device following the manufacturing step of FIG. 27.

Next, as shown in FIG. 28, the pMIS forming region is covered with a resist pattern, and with the gate electrode 39 and sidewall 50 as a mask, cluster carbon (e.g., $C_7H_7$) which is a compound of carbon and hydrogen is ion-implanted into the nMIS forming region of the semiconductor substrate 31, as with Embodiment 1 described above, to amorphize the semiconductor substrate 31 (p-type well 33) on both sides of the sidewall 50 and form a amorphous layer 53.

In this case, in order not to change the concentration profile of the previously formed n-type diffusion region 51, the above-described cluster carbon is ion-implanted so that the maximum concentration of carbon exists in a region shallower than the depth Ld of the previously formed n-type diffusion region 51. For example, the implantation energy in the ion implantation of carbon in a range of 6 to 10 keV per carbon atom and the implantation quantity in a range of 1 to $5E15/cm^2$ may be preferable (but not limited to this range depending on the other conditions, of course), and furthermore a range with the center value of $3E15/cm^2$ may be the most preferable.

Since the pMIS forming region is covered with a resist pattern, the p-type diffusion region (the silicon germanium layer) 45 on both sides of the sidewall 50 is not amorphized.

Figure 29:
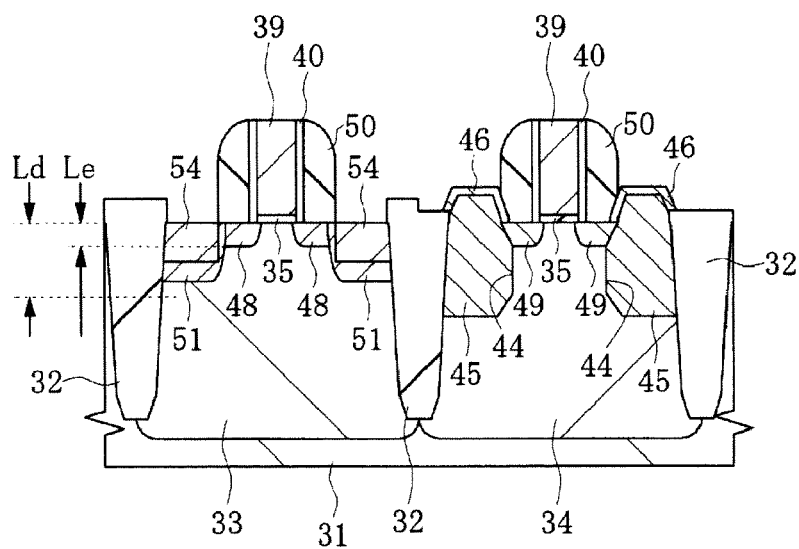
FIG. 29 is a cross-sectional view of the major portion of the same portion as that of FIG. 15 in a manufacturing step of the CMIS device following the manufacturing step of FIG. 28.

Next, as shown in FIG. 29, as with Embodiment 1 described above, by applying a heat treatment to the semiconductor substrate 31 (the second heat treatment), the amorphous layer 53 is recrystallized to form the Si:C layer 54 in which a part of the silicon lattice is substituted with carbon. The concentration of the carbon substituting for the silicon is approximately 1 to 2 at %, for example, and the sheet resistance of the Si:C layer 54 becomes 300 Ω/sq., for example. Moreover, the Si:C layer 54 is formed so that the maximum concentration of carbon exists between the depth Le of the n-type extension region 48 and the depth Ld of the n-type diffusion region 51.

Figure 30:
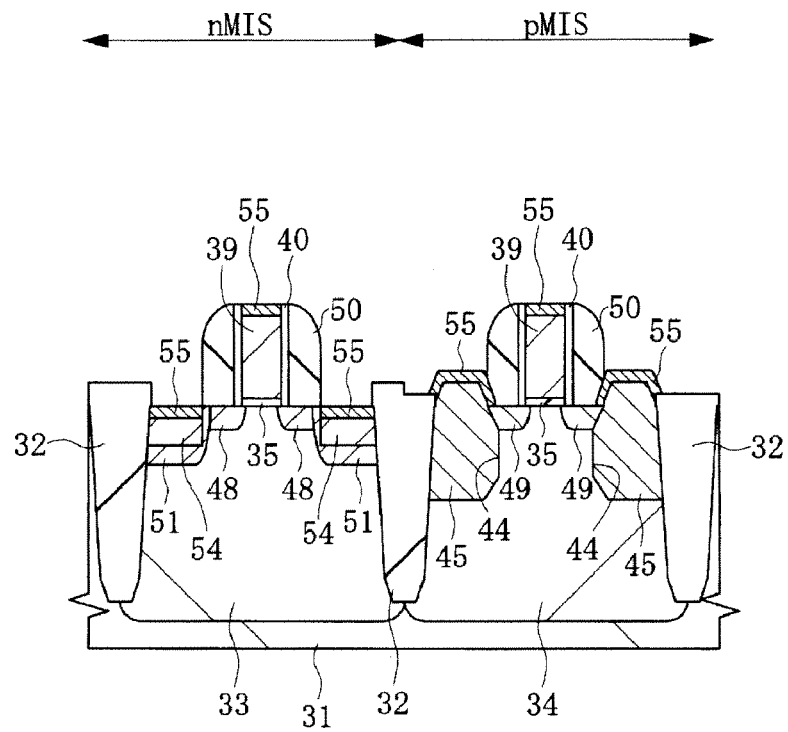
FIG. 30 is a cross-sectional view of the major portion of the same portion as that of FIG. 15 in a manufacturing step of the CMIS device following the manufacturing step of FIG. 29.

Next, as shown in FIG. 30, the silicide film 55 is selectively formed in the upper surface of the gate electrode of the pMIS and the p-type diffusion region 45, respectively, and in the upper surface of the gate electrode of the nMIS and the n-type diffusion region 51, respectively. The silicide film 55 is a nickel silicide film or a cobalt silicide film, for example.

Figure 31:
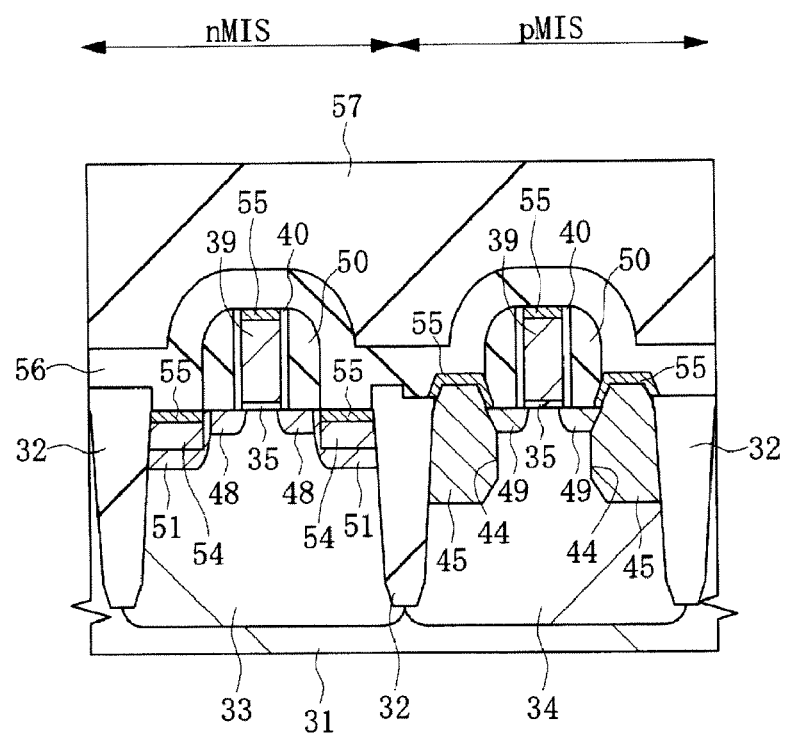
FIG. 31 is a cross-sectional view of the major portion of the same portion as that of FIG. 15 in a manufacturing step of the CMIS device following the manufacturing step of FIG. 30.

Next, as shown in FIG. 31, the silicon nitride film 56 and the interlayer insulating film 57 are sequentially formed over the major surface of the semiconductor substrate 31. The interlayer insulating film 57 is a TEOS film, a silicon oxynitride film, or a silicon oxide film, for example. Subsequently, the interlayer insulating film 57 is polished by CMP to planarize the surface thereof.

Figure 32:
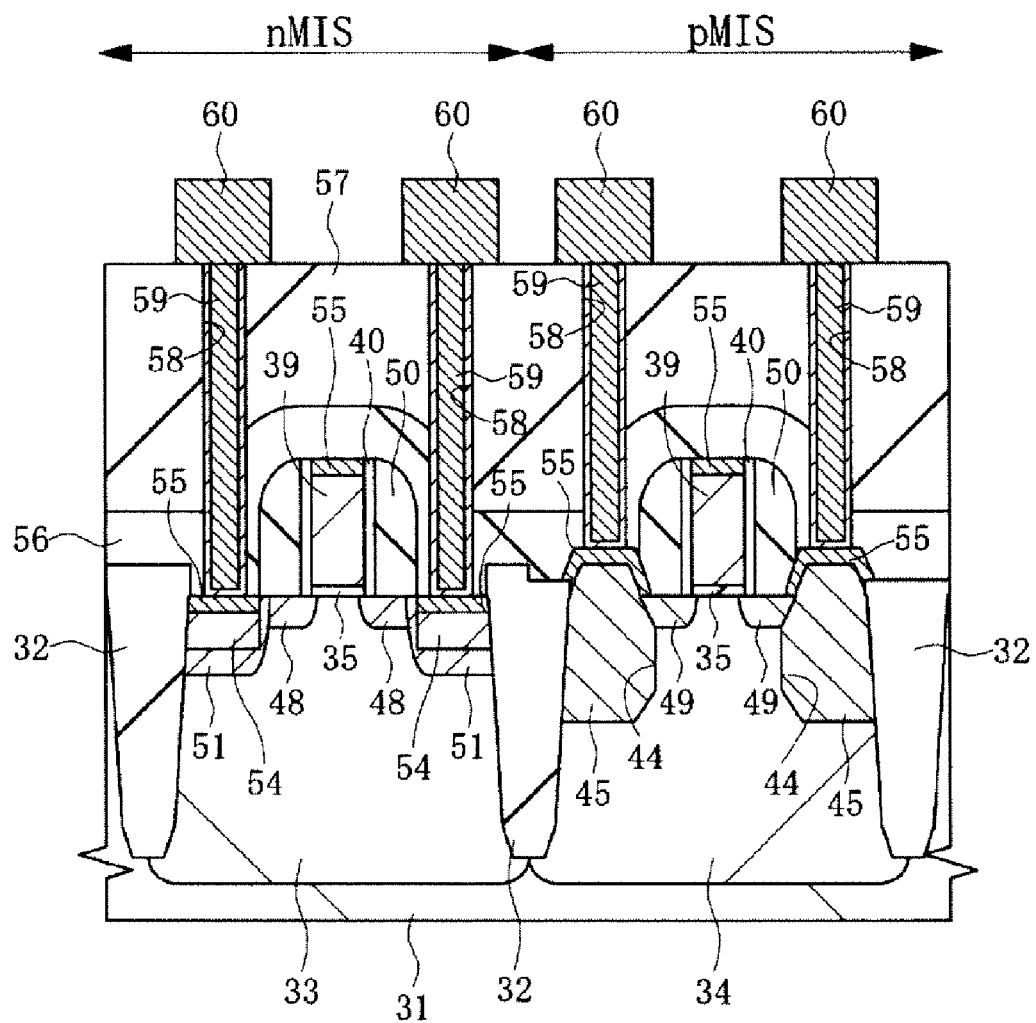
FIG. 32 is a cross-sectional view of the major portion of the same portion as that of FIG. 15 in a manufacturing step of the CMIS device following the manufacturing step of FIG. 31.

Next, as shown in FIG. 32, by dry etching with a resist pattern as a mask, the connecting hole 58 is formed at a predetermined portion of the silicon nitride film 56 and the interlayer insulating film 57. Subsequently, a barrier metal film (e.g., a titanium nitride film) and a metal film (e.g., a tungsten film) are sequentially deposited over the major surface of the semiconductor substrate 31 including over the inside of the connecting hole 58, and subsequently the barrier metal film and the metal film are polished by CMP, and then the barrier metal film and the metal film are embedded inside the connecting hole 58 to form the plug 59. The barrier metal film has a function to prevent the metal film from diffusing into the semiconductor substrate 31.

Subsequently, a metal film (e.g., an aluminum film or a copper film) is deposited over the major surface of the semiconductor substrate 31, and then by dry etching with a resist pattern as a mask, this metal film is processed to form the wiring 60. With the above-described manufacturing steps, the CMIS device according to Embodiment 2 is almost completed.

It should be noted that, in Embodiment 2, the gate insulating film 35 of the nMIS and pMIS comprises a silicon oxide film or a silicon oxynitride film, for example, and the gate electrode 39 comprises a polysilicon film, for example. However, as with Embodiment 1 described above, the gate insulating film 35 of the nMIS and pMIS may comprise a High-k film, for example, and the gate electrode 39 may comprise a stacked film of a titanium nitride film and a polysilicon film, for example.

In this manner, according to Embodiment 2, a compression stress is applied to the channel of the pMIS by forming the P-type diffusion region 45 mainly constituting the source/drain of the pMIS from the silicon germanium layer into which p-type impurities are introduced, and thus the silicon in the channel can be strained. Moreover, a tensile stress is applied to the channel of the nMIS by forming the Si:C layer 54 in the n-type diffusion region 51 mainly constituting the source/drain of the nMIS, and thus the silicon in the channel can be strained. These allow the improvement of the mobility of holes in the pMIS and the mobility of electrons in the nMIS, and thus the operating characteristics of the CMIS device, which are formed using the strained silicon technique, can be improved.

The present invention made by the present inventor has been described specifically based on the embodiments, but it is needless to say that the present invention is not limited to the embodiments and various modifications are possible without departing from the scope of the invention.

The present invention can be applied to semiconductor devices with a field effect transistor which achieves an increase in the speed by utilizing the strain in a channel.

What is claimed is:

1. A method of manufacturing a semiconductor device having an n-channel field effect transistor formed in a major surface of a semiconductor substrate, the method comprising the steps of:
    (a) sequentially forming a gate insulating film and a gate electrode in a major surface of the semiconductor substrate having a p-type well formed therein;
    (b) forming a first n-type impurity diffusion layer by ion-implanting first n-type impurities into the semiconductor substrate on both sides of the gate electrode;
    (c) forming a sidewall comprising an insulating film in a sidewall of the gate electrode;
    (d) forming a second n-type impurity diffusion layer by ion-implanting second n-type impurities into the semiconductor substrate on both sides of the sidewall;
    (e) forming a source/drain comprising the first n-type impurity diffusion layer and the second n-type impurity diffusion layer by applying a first heat treatment to the semiconductor substrate and thereby activating the first n-type impurities and the second n-type impurities;
    (f), after the step (e), forming an amorphous layer by ion-implanting cluster carbon into the second n-type impurities diffusion layer, and
    (g), forming a Si:C layer by applying a second heat treatment to the semiconductor substrate and thereby recrystallizing the amorphous layer, wherein
    a position of a second junction between the second n-type impurity diffusion layer and the p-type well in a thickness direction of the semiconductor substrate is deeper than a position of a first junction between the first n-type impurity diffusion layer and the p-type well in the thickness direction of the semiconductor substrate, and wherein a position, at which a concentration of the carbon contained in the Si:C layer becomes the maximum, is deeper than the position of the first junction between the first n-type impurity diffusion layer and the p-type well in the thickness direction of the semiconductor substrate and is shallower than the position of the second junction between the second n-type impurity diffusion layer and the p-type well in the thickness direction of the semiconductor substrate.

2. The method of manufacturing a semiconductor device according to claim 1, further comprising the step of (h), after the step (g), forming a silicide layer in an upper surface of the second n-type impurity diffusion layer.

3. The method of manufacturing a semiconductor device according to claim 1, wherein the cluster carbon is $C_7H_7$.

4. The method of manufacturing a semiconductor device according to claim 1, wherein in the step (f), an implantation energy of the cluster carbon is 6 to 10 keV per carbon atom, and an implantation quantity is in a range of 1 to $5E15/cm^2$.

5. The method of manufacturing a semiconductor device according to claim 1, wherein the second heat treatment of the step (g) is LSA or FLA, the temperature thereof is 1100 to 1350° C., and the time therefor is equal to or less than 1 millisecond.

6. The method of manufacturing a semiconductor device according to claim 1, wherein the gate insulating film is a High-k film.

* * * * *